US010217681B1

(12) United States Patent
Royer et al.

(10) Patent No.: US 10,217,681 B1
(45) Date of Patent: Feb. 26, 2019

(54) GASES FOR LOW DAMAGE SELECTIVE SILICON NITRIDE ETCHING

(71) Applicant: American Air Liquide, Inc., Fremont, CA (US)

(72) Inventors: James Royer, Bear, DE (US); Venkateswara R. Pallem, Hockessin, DE (US); Rahul Gupta, Newark, DE (US)

(73) Assignee: American Air Liquide, Inc., Fremont, CA (US)

( * ) Notice: Subject to any disclaimer, the term of this patent is extended or adjusted under 35 U.S.C. 154(b) by 269 days.

(21) Appl. No.: 14/694,702

(22) Filed: Apr. 23, 2015

Related U.S. Application Data

(60) Provisional application No. 62/033,974, filed on Aug. 6, 2014.

(51) Int. Cl.
*H01L 21/66* (2006.01)
*H01L 21/311* (2006.01)

(52) U.S. Cl.
CPC ........ *H01L 22/26* (2013.01); *H01L 21/31116* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 3,615,956 A | 10/1971 | Irving et al. | |
| 4,529,476 A | 7/1985 | Kawamoto et al. | |
| 5,786,276 A | 7/1998 | Brooks et al. | |
| 5,968,846 A | 10/1999 | Chou et al. | |
| 6,117,791 A | 9/2000 | Ko et al. | |
| 6,366,346 B1 * | 4/2002 | Nowak | C23C 16/4401 216/60 |
| 6,656,375 B1 | 12/2003 | Armacost et al. | |
| 6,833,325 B2 | 12/2004 | Huang et al. | |
| 6,916,746 B1 | 7/2005 | Hudson et al. | |
| 8,193,007 B1 * | 6/2012 | Madriaga | H01J 37/32935 257/E21.521 |
| 2001/0005634 A1 | 6/2001 | Kajiwara | |

(Continued)

FOREIGN PATENT DOCUMENTS

| | | |
|---|---|---|
| JP | S63 99535 | 4/1988 |
| JP | 2010 020831 | 1/2010 |
| WO | WO 2002/003439 | 1/2002 |

OTHER PUBLICATIONS

Blanc, et al., "Patterning of silicon nitride for CMOS gate spacer technology. II. Impact of subsilicon surface carbon implantation on epitaxial regrowth", J. Vac. Sci. Technol. B 32(2), Mar./Apr. 2014, 021806-1-021806-7.

(Continued)

*Primary Examiner* — David E Graybill
(74) *Attorney, Agent, or Firm* — Patricia E. McQueeney

(57) ABSTRACT

Silicon nitride plasma etching processes are disclosed that minimize the SiN roughness layer on a substrate having a SiN layer thereon by simultaneously introducing an oxidizer at a predetermined flow rate and an etch gas into a plasma reaction chamber containing the substrate. The etch gas has the formula $C_xH_yF_z$, wherein x is 2-5, z is 1 or 2, $2x+2=y+z$, and a fluorine atom is located on a terminal carbon atom of the etch gas.

22 Claims, 19 Drawing Sheets

CH₃F

CH₃F

(56) References Cited

U.S. PATENT DOCUMENTS

| | | | |
|---|---|---|---|
| 2009/0020776 A1* | 1/2009 | Lin | H01L 33/382 257/98 |
| 2009/0176375 A1* | 7/2009 | Benson | H01L 21/31116 438/719 |
| 2011/0068086 A1 | 3/2011 | Suzuki et al. | |
| 2011/0318936 A1 | 12/2011 | Ko et al. | |
| 2013/0105916 A1 | 5/2013 | Chang et al. | |
| 2013/0105947 A1 | 5/2013 | Fuller et al. | |
| 2013/0105996 A1 | 5/2013 | Brink et al. | |
| 2013/0108833 A1 | 5/2013 | Brink et al. | |
| 2014/0287588 A1* | 9/2014 | Takahashi | C30B 25/186 438/694 |
| 2016/0145177 A1* | 5/2016 | Sugimoto | C07C 17/395 570/178 |

OTHER PUBLICATIONS

Chen, et al., "Mechanism of selective Si3N4 etching over SiO2 in hydrogen-containing fluorocarbon plasma"; Microelectronic Engineering 86 (2009) 2354-2357.

Reyes-Betanzo, et al., "Plasma Etching of Silicon Nitride with High Selectivity over Silicon Oxide and Silicon in Fluorine Containing Plasmas", Vac. Sci. Technol. A 17 (6), 3179 (1999).

Flamm, D.K. et al., "Plasma etching: an introduction," Academic Press, Inc., San Diego, CA, D.M. Manos and D.L. Flamm, eds., 1989, pp. 10-13.

Lehman, H.W., "Thin Film Processes II," Academic Press, Inc., San Diego, CA, John L. Vossen and Werner Kern, eds., 1991, pp. 673-679 and 738-748.

* cited by examiner

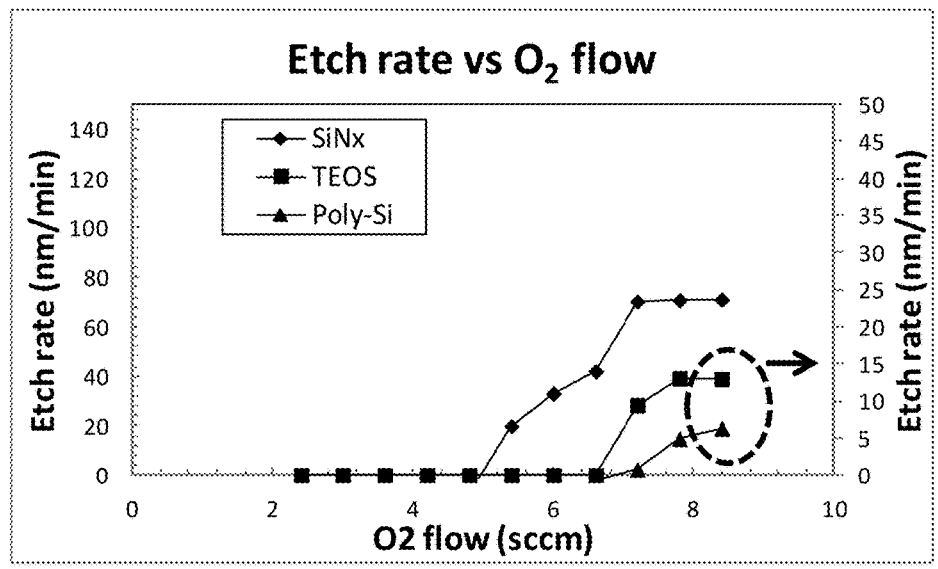
FIG 2 - CH₃F

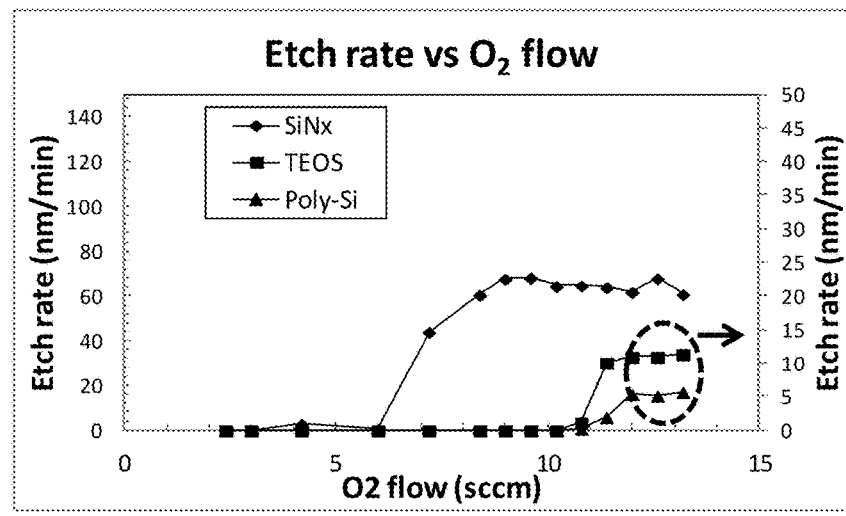
FIG 3 - C₂H₅F
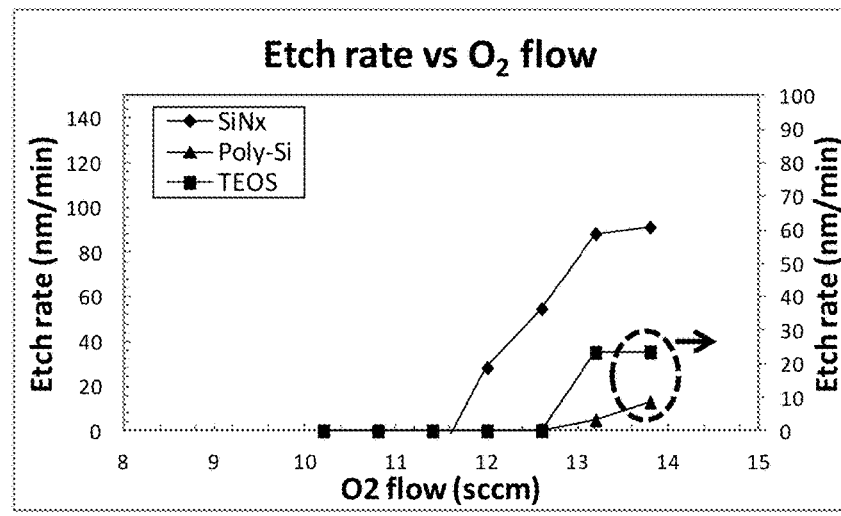
FIG 4 – C₂H₃F₃

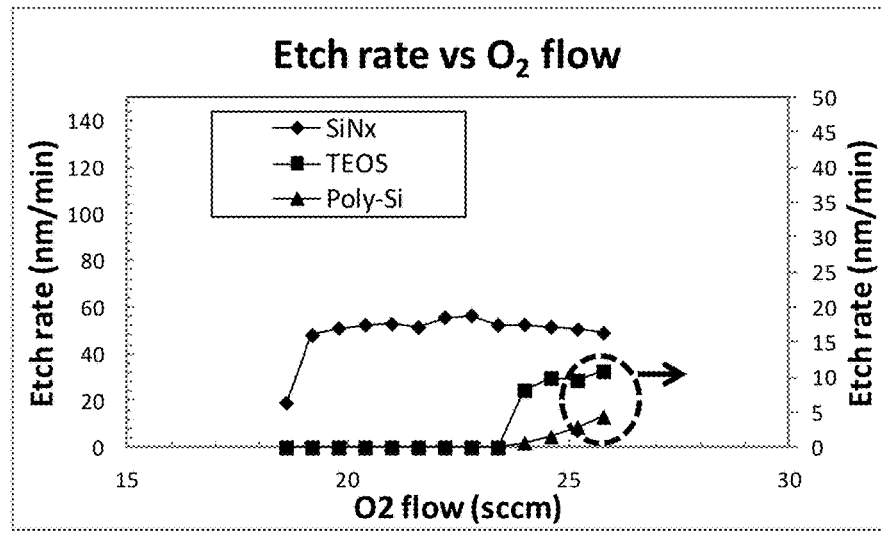
FIG 5 – $C_3H_7F$
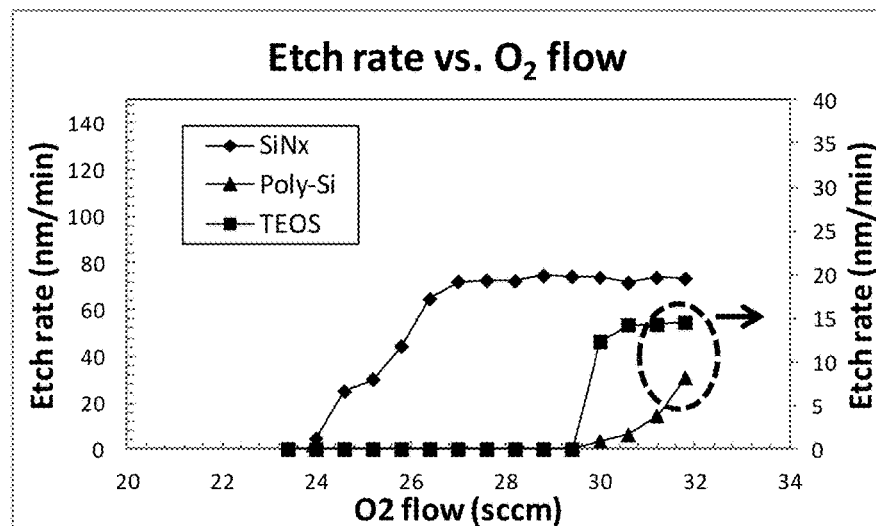
FIG 6 – $1,1\text{-}F_2\text{-}C_3H_6$

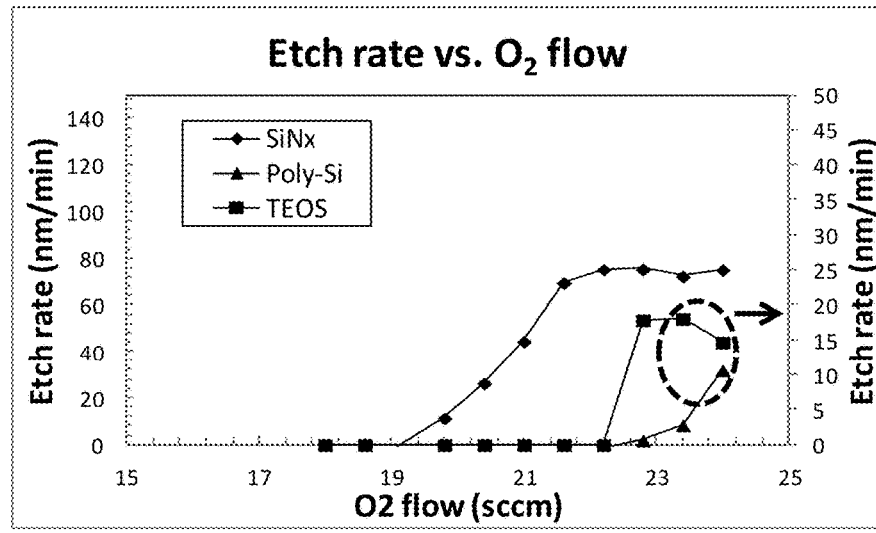
FIG 7 – 1,1,1-$F_3$-$C_3H_5$
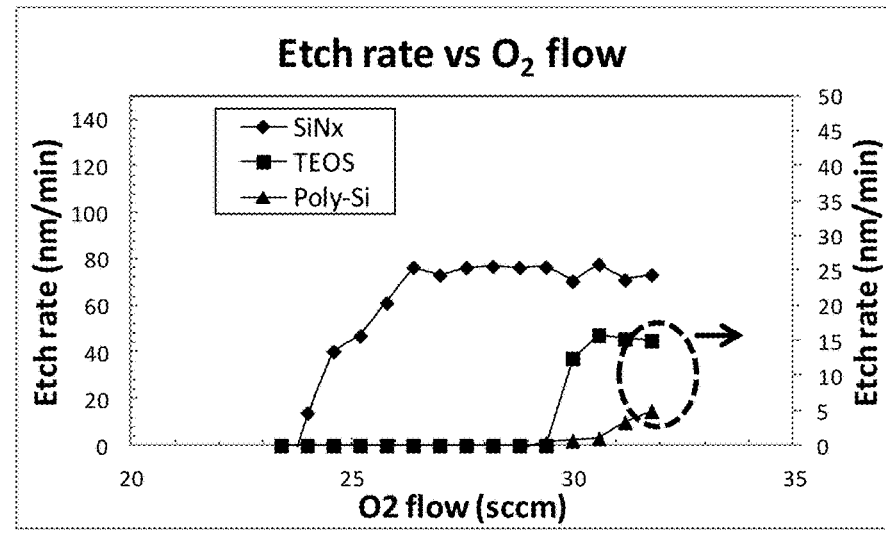
FIG 8 – 1,2-$F_2$-$C_3H_6$

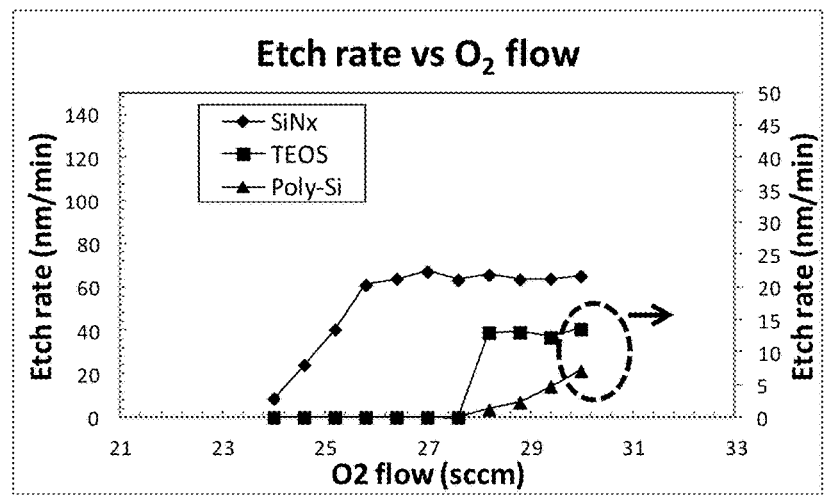
FIG 9 – 1,3-$F_2$-$C_3H_6$
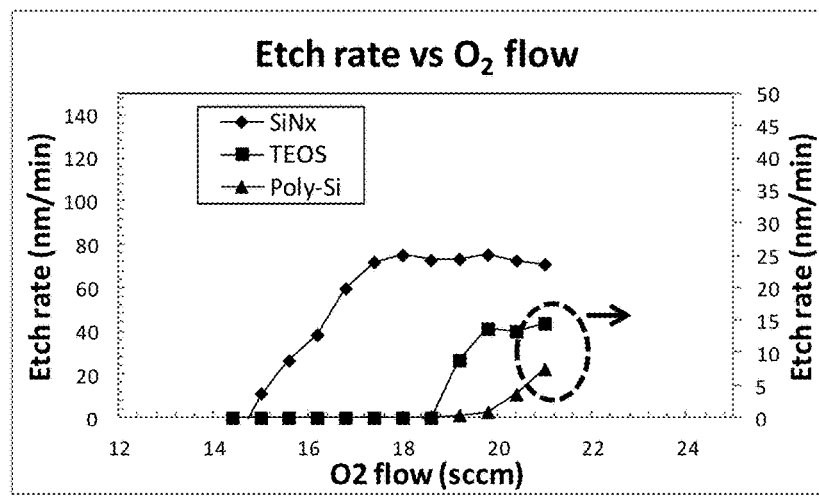
FIG 10 – 2,2-$F_2$-$C_3H_6$

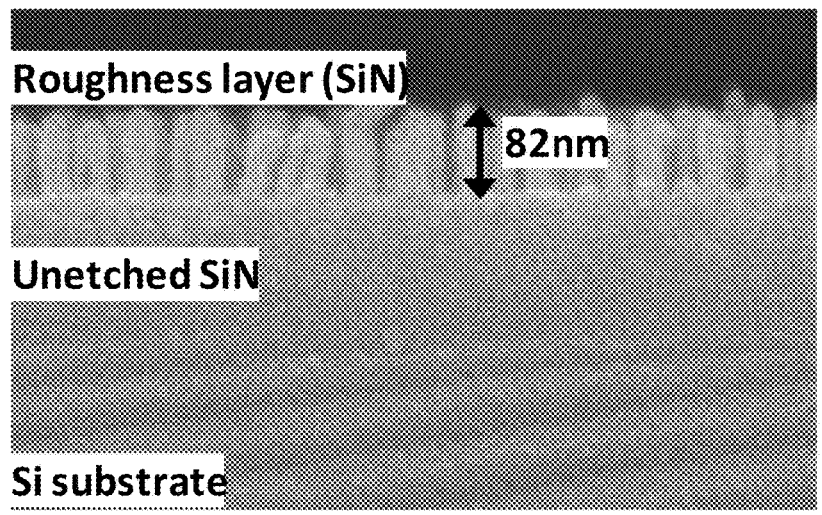
FIG 11 – CH$_3$F
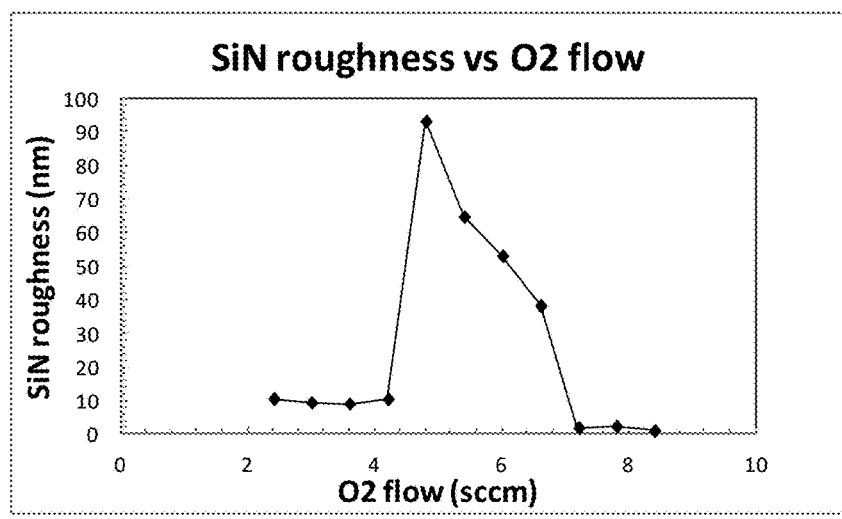
FIG 12 – CH$_3$F

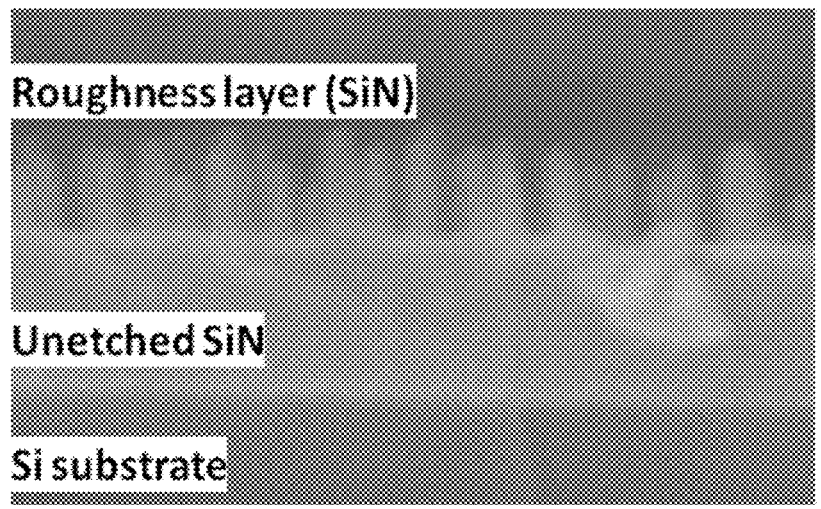
FIG 13 – 1,1,2-$F_3$-$C_2H_3$
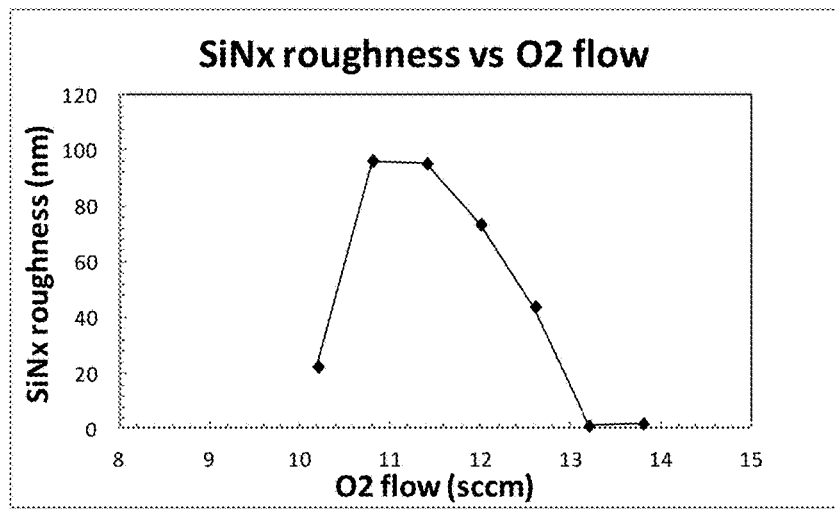
FIG 14– 1,1,2-$F_3$-$C_2H_3$

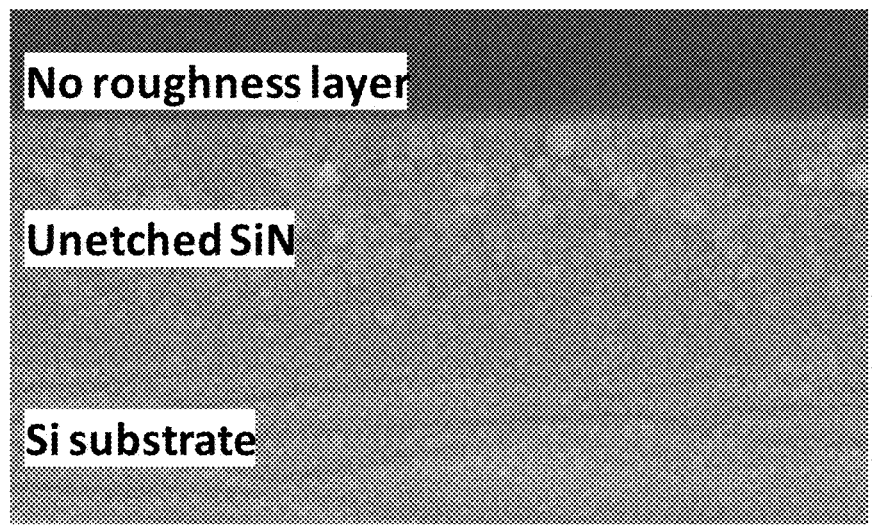
FIG 15 – $C_3H_7F$
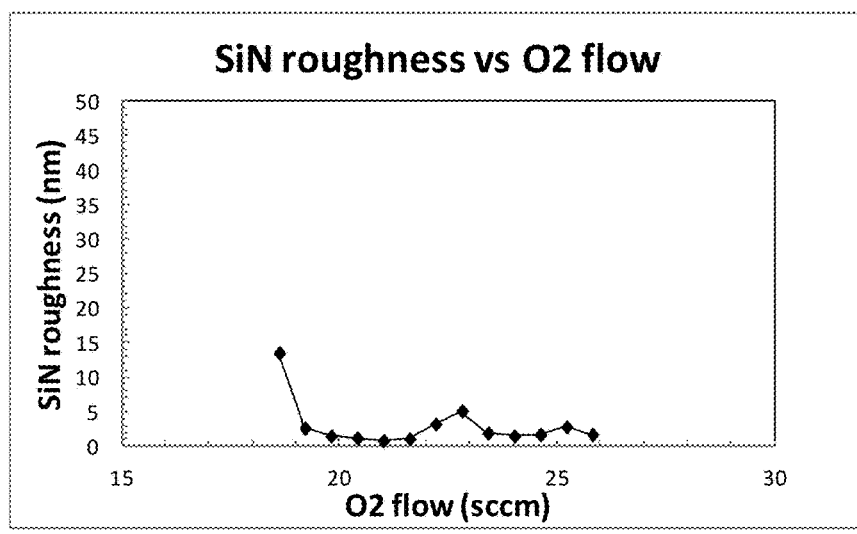
FIG 16– $C_3H_7F$

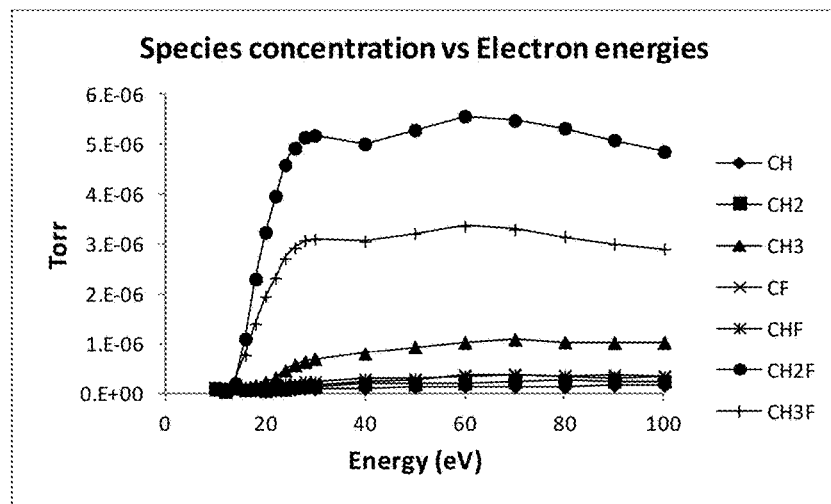
FIG 17 – CH₃F
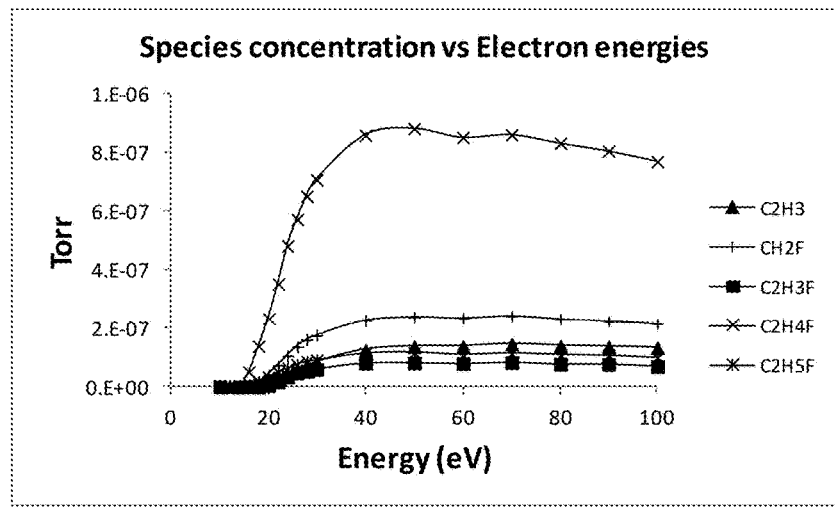
FIG 18 – C₂H₅F

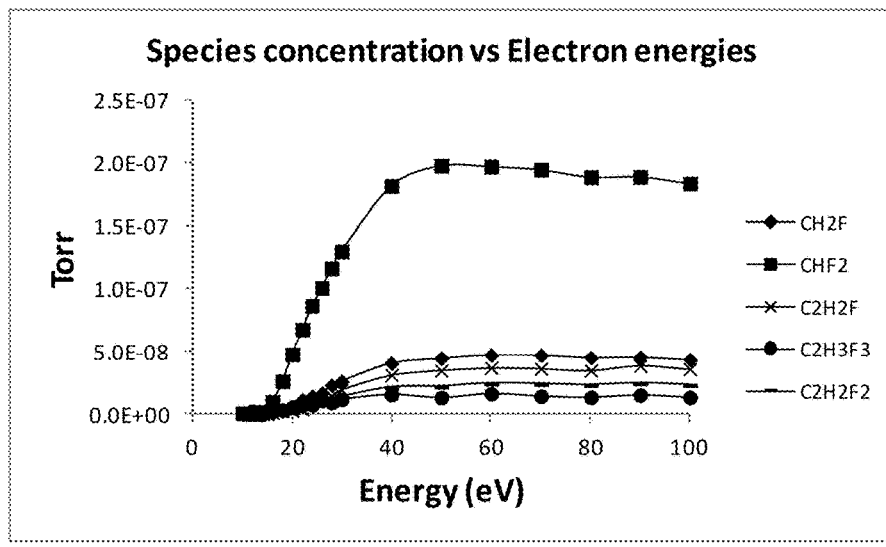
FIG 19 – 1,1,2-$C_2H_3F_3$
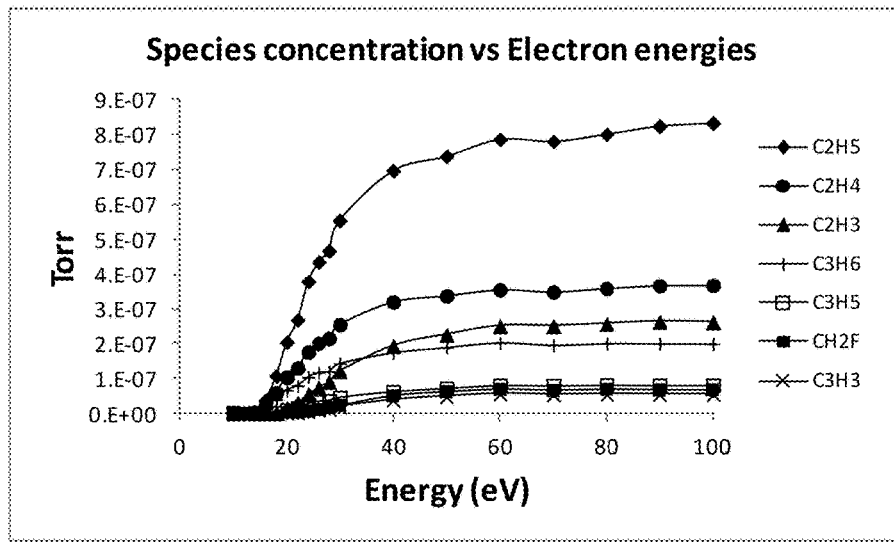
FIG 20 – $C_3H_7F$

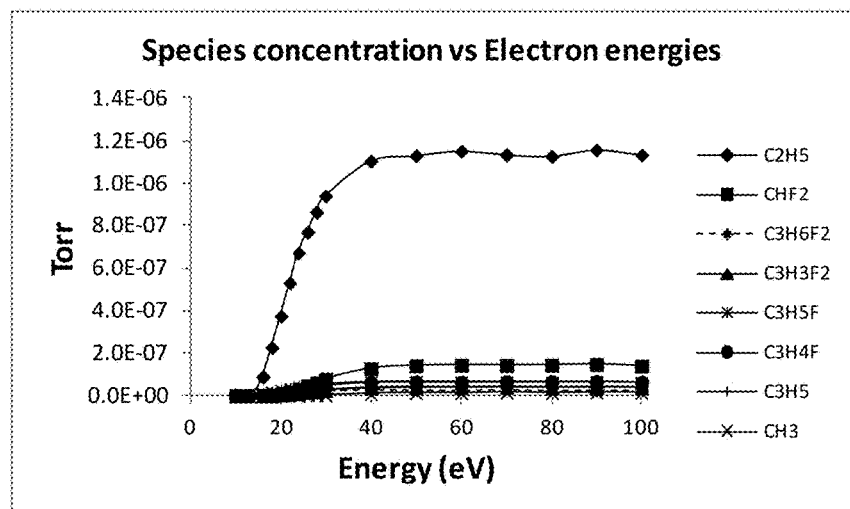
FIG 21 – 1,1-$F_2$-$C_3H_6$
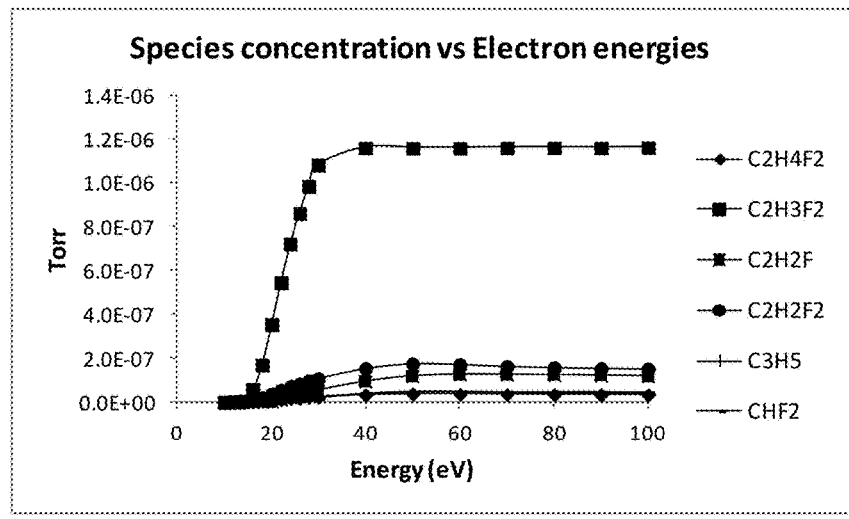
FIG 22 – 2,2-$F_2$-$C_3H_6$

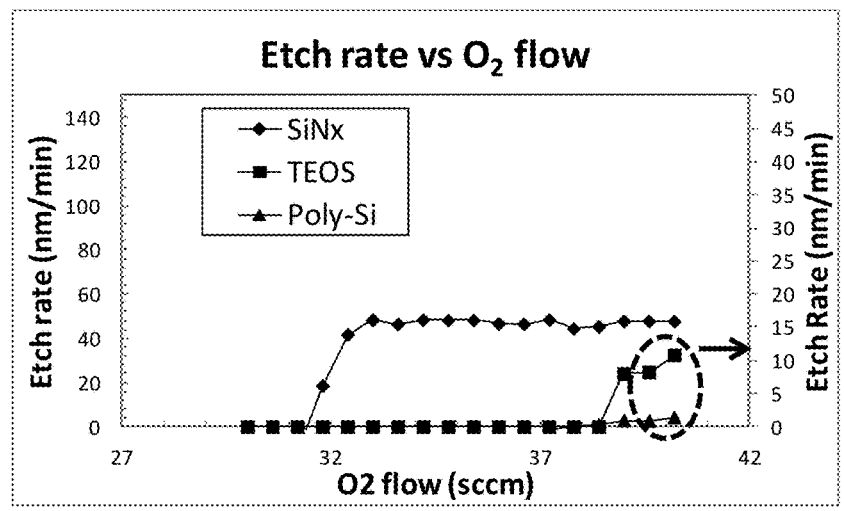
FIG 23 – 1-F-C$_4$H$_9$
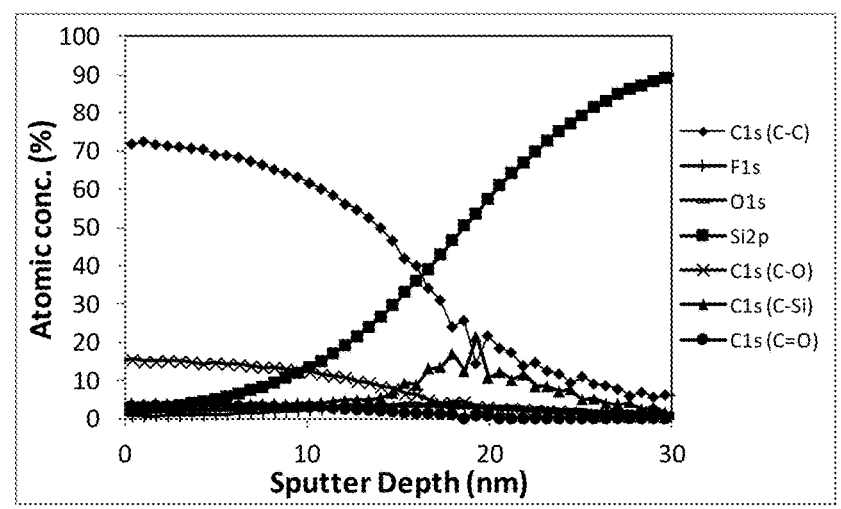
FIG 24 – C$_3$H$_7$F on poly-Si Substrate

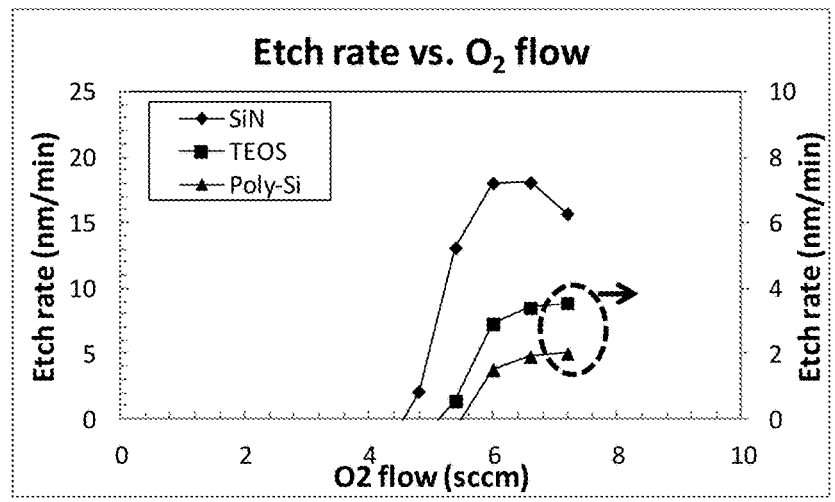
FIG 25 – $CH_3F$
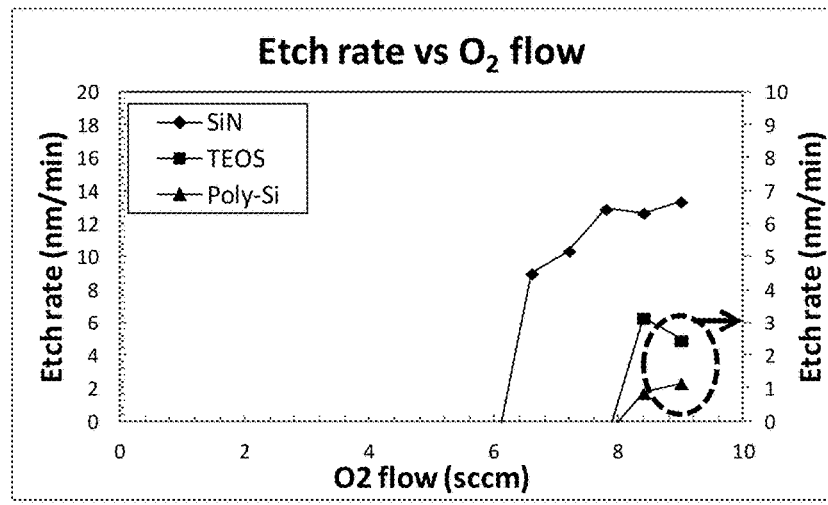
FIG 26 – $1$-$F$-$C_2H_5$

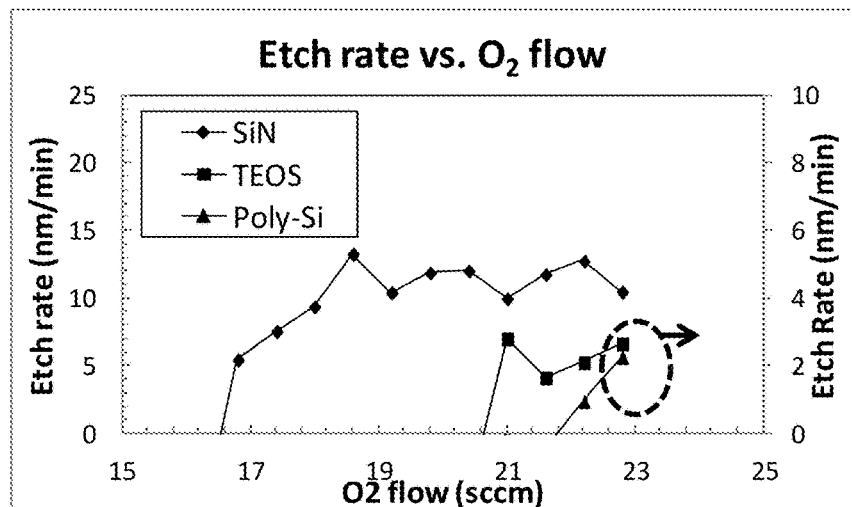
FIG 27 – 1-F-C₃H₇
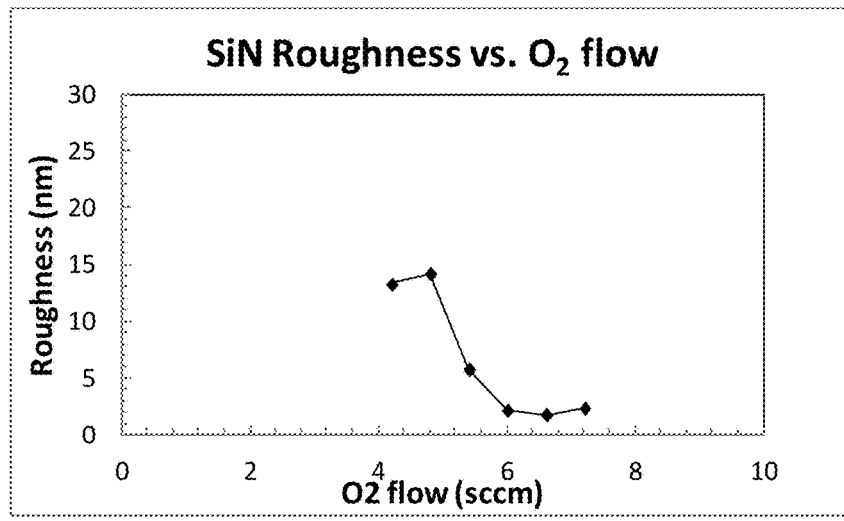
FIG 28 – CH₃F

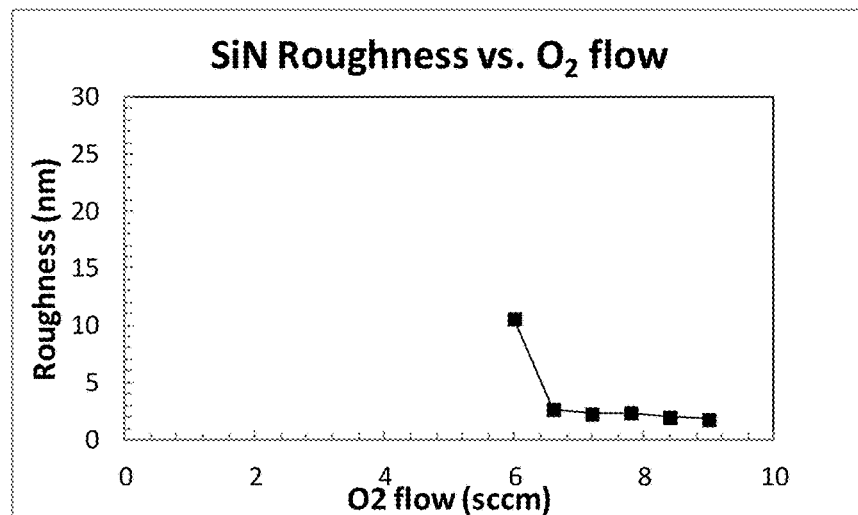
FIG 29 – 1-F-C₂H₅
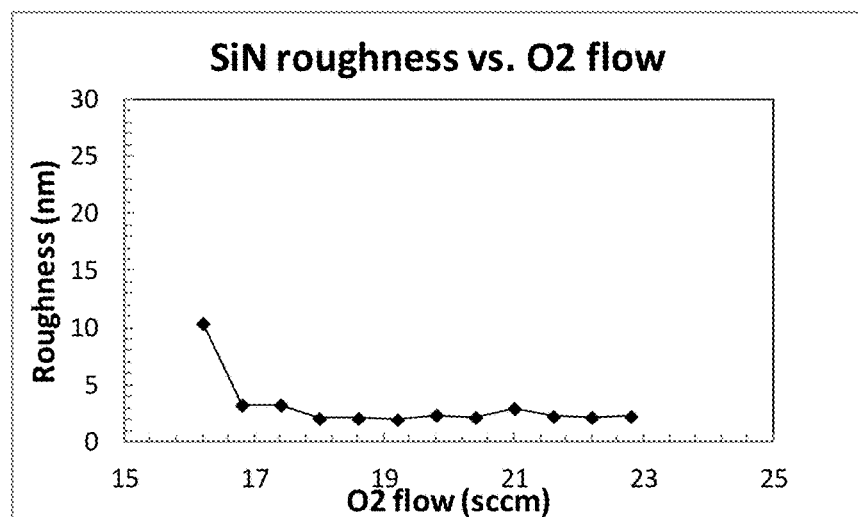
FIG 30 – 1-F-C₃H₇

GASES FOR LOW DAMAGE SELECTIVE SILICON NITRIDE ETCHING

CROSS REFERENCE TO RELATED APPLICATIONS

The present application claims the benefit of U.S. Provisional Application Ser. No. 62/033,974 filed Aug. 6, 2014, herein incorporated by reference in its entirety for all purposes.

TECHNICAL FIELD

Silicon nitride plasma etching processes are disclosed that minimize the SiN roughness layer on a substrate having a SiN layer thereon by simultaneously introducing an oxidizer at a predetermined flow rate and an etch gas into a plasma reaction chamber containing the substrate. The etch gas has the formula $C_xH_yF_z$, wherein x is 2-5, z is 1 or 2, $2x+2=y+z$, and a fluorine atom is located on a terminal carbon atom of the etch gas.

BACKGROUND

Scaling of transistor gates to smaller dimensions requires processing of thinner gate stack side-wall insulating layers. Such insulating layers, referred to herein as gate spacer layers, are typically composed of silicon nitride. These layers are typically applied conformally to the substrate and then patterned using subtractive wet or dry etch processes. The process must be highly selective to the substrate material and etch the insulating layer anisotropically. These requirements make dry etching the preferred method since wet etching is typically isotropic.

U.S. Pat. No. 4,529,476 to Kawamoto et al. disclose a dry etching gas suitable for selective etching of silicon nitride and a process for selectively dry-etching silicon nitride with the dry-etching gas consisting of C, H, and F atom species and having a ratio of F to H by atom of not more than 2.

Reyes-Betanzo et al. disclose higher oxide and nitride film roughness results for oxygen-free plasma etch processes using $CF_4$ or $SF_6$ etch gases (Vac. Sci. Technol. A 17 (6) 3179 (1999)).

U.S. Pat. No. 6,117,791 to Ko et al. and WO2002/03439 to Micron disclose the use of fluoroethane to selectively etch doped SiO from undoped SiO and SiN. Thus, these applications promote SiN as an etch stop for fluoroethane.

US2011/0068086 to Suzuki et al. and US2013/105916 to Chang et al. disclose anisotropic silicon nitride etch processes providing selectivity to silicon and silicon oxide using fluorohydrocarbon gases having the composition $C_xH_yF_z$, wherein x is an integer selected from 3, 4, 5, and 6; y and z are positive integers; and y is greater than z.

It is well known in the art that $SiN/SiO_2$ and SiN/Si selectivity increases as the ratio of H to F increases (i.e. $CH_3F>CH_2F_2>CHF_3$). See, e.g., Chen et. al. (Microelectronic Engineering 86, (2009)).

However, reports have shown that the preferred etch gas, $CH_3F$, may implant carbon into the silicon substrate during nitride spacer etching, requiring an additional processing step ($HBr/O_2$ or $N_2/H_2$ plasma) to remove C—Si bonds prior to the silicon epitaxy step. Blanc et al., Journal of Vacuum Science & Technology B 32 (2) (March/April 2014).

Additionally, as further explained in more detail in the present application, while H rich etch molecules may selectively etch silicon nitride, some of these etch gases have characteristics which are not desirable for application in gate spacer layer etching.

A need remains for SiN etching processes suitable for gate spacer layer etching without detriment to the processes that follow.

NOTATION AND NOMENCLATURE

Certain abbreviations, symbols, and terms are used throughout the following description and claims, and include:

As used herein, the indefinite article "a" or "an" means one or more.

As used herein, the terms "approximately" or "about" mean±10% of the value stated.

As used herein, the term "etch" or "etching" refers to a plasma etch process (i.e., a dry etch process) in which ion bombardment accelerates the chemical reaction in the vertical direction so that vertical sidewalls are formed along the edges of the masked features at right angles to the substrate (Manos and Flamm, Plasma Etching An Introduction, Academic Press, Inc. 1989 pp. 12-13).

The term "selectivity" means the ratio of the etch rate of one material to the etch rate of another material. The term "selective etch" or "selectively etch" means to etch one material more than another material, or in other words to have a greater or less than 1:1 etch selectivity between two materials. Infinite selectivity occurs when the etch gas etches one material but does not etch the other.

As used herein, the abbreviation "FinFET" refers to a fin structured field-effect transistor; the abbreviation "FD-SOI" refers to fully-depleted silicon-on-insulator; and the abbreviation "3D" refers to 3 dimensional or vertical gate structures.

The standard abbreviations of the elements from the periodic table of elements are used herein. It should be understood that elements may be referred to by these abbreviations (e.g., N refers to nitrogen, Si refers to silicon, H refers to hydrogen, etc.).

Please note that the silicon nitride, silicon oxide, and silicon layers, such as SiN, SiO and poly-Si, are listed throughout the specification and claims without reference to their proper stoichoimetry. The silicon layers may include pure silicon (Si) layers, such as crystalline Si, polysilicon (poly-Si or polycrystalline Si), or amorphous silicon. The SiN layers may optionally include other atoms, such as oxygen, carbon, or boron (i.e., $Si_aN_b$, $SiO_aN_b$, $SiC_cN_b$, $SiO_aC_cN_b$, or $SiB_dC_cN_b$, wherein each of a, b, c, and d independently range from approximately 0.05 to approximately 0.95). The silicon oxide ($Si_nO_m$) layers may have stoichiometry wherein m and n inclusively range from 1 to 6. Preferably silicon oxide is $Si_nO_m$, where n ranges from 0.5 to 1.5 and m ranges from 1.5 to 3.5. More preferably, silicon oxide is $SiO_2$ or $SiO_3$. The silicon oxide layer could also be a dielectric material, such as organic based or silicon oxide based low-k dielectric materials such as the Black Diamond II or III material by Applied Materials, Inc. Any of the silicon-containing layers (i.e., Si, SiN, SiO) may also include dopants, such as B, C, P, As and/or Ge.

SUMMARY

Silicon nitride plasma etching processes for etching SiN layers from substrates are disclosed. A SiN roughness layer between approximately 0 nm and 10 nm thick is generated during the silicon nitride plasma etching process by simultaneously introducing an oxidizer at a predetermined flow rate and an etch gas into a plasma reaction chamber containing the substrate. The etch gas has the formula $C_xH_yF_z$, wherein x is 2-5, z is 1 or 2, 2x+2=y+z, and a fluorine atom is located on a terminal carbon atom of the etch gas. The disclosed processes may include one or more of the following aspects:

producing infinite SiN to substrate selectivity;
determining the predetermined flow rate by (a) plotting a SiN etch rate for the etch gas on a Y axis versus oxidizer flow rate on a X axis; (b) plotting a substrate etch rate for the etch gas on a Y axis versus oxidizer flow rate on a X axis; and (c) selecting the predetermined flow rate when the SiN etch rate is positive, the substrate etch rate is equal to or less than 0 nm/minute, and the SiN etch rate remains approximately the same with increasing oxidant flow rate;
determining the predetermined flow rate by optical or surface topography analysis of a substrate having a partial SiN layer deposited thereon to determine an oxidizer flow rate that (a) etches the SiN layer, (b) does not etch the substrate, and (c) does not generate a SiN roughness layer greater than 10 nm thick, wherein the partial SiN layer does not cover the entire substrate;
optically analyzing the substrate with an ellipsometer;
optically analyzing the substrate with an electron microscope;
optically analyzing the substrate with a scanning electron microscope;
optically analyzing the substrate with a transmission electron microscope;
analyzing the surface topography of a substrate with an atomic force microscope;
ending the process by measuring a time when the substrate below the SiN layer begins to accumulate polymer deposits;
the etch gas selectively reacting with SiN to form volatile by-products;
removing volatile by-products from the plasma reaction chamber;
analyzing the volatile by-products removed from the plasma reaction chamber;
ending the process when generation of volatile by-products ceases;
z being 1;
the etch gas being selected from the group consisting of fluoroethane, 1-fluoropropane; 1-fluorobutane; and 1-fluoropentane;
the etch gas being fluoroethane;
the etch gas being 1-fluoropropane;
the etch gas being 1-fluorobutane;
the etch gas being 1-fluoropentane;
z being 2;
x being 3;
the etch gas being 1,1-difluoropropane;
the etch gas being 1,2-difluoropropane;
the etch gas being 1,1-difluorobutane;
the etch gas being 1,2-difluorobutane;
the etch gas being 1,1-difluoropentane;
the etch gas being 1,2-difluoropentane;
the oxidizer being selected from the group consisting of $O_2$, CO, $CO_2$, NO, $N_2O$, $NO_2$, $SO_2$, $O_3$, and combinations thereof; and
the oxidizer being $O_2$.
mixing the etch gas and the oxidizer prior to introduction to the chamber;
introducing the etch gas into the chamber separately from the oxidizer;
introducing the oxidizer continuously to the chamber and introducing the etch gas to the chamber in pulses;
introducing into the chamber approximately 5% v/v to approximately 100% v/v of oxidizer;
introducing an inert gas into the plasma reaction chamber;
the inert gas being selected from the group consisting of He, Ar, Xe, Kr, and Ne;
the inert gas being Ar;
mixing the etch gas and the inert gas prior to introduction into the chamber to produce a mixture;
introducing the etch gas into the chamber separately from the inert gas;
introducing the inert gas being continuously into the chamber and introducing the etch gas into the chamber in pulses;
the inert gas comprising approximately 25% v/v to approximately 95% v/v of a total volume of etch gas, oxidizer and inert gas introduced into the plasma reaction chamber;
the silicon nitride layer being selected from the group consisting of silicon nitride, silicon oxynitride, silicon oxycarbonitride, silicon carbonitride, silicon borocarbonitride, and combinations thereof;
the substrate being selected from the group consisting of silicon, polysilicon, silicon oxide, SiGe, Ge, GaAs, InGaAs, InP, InAs, or combinations thereof;
the substrate being polysilicon;
the substrate being silicon dioxide;
selectively etching the silicon nitride layer from a silicon oxide layer;
selectively etching the silicon nitride layer from a polysilicon layer;
the silicon nitride plasma etching processes etching a gate spacer layer;
the etched gate spacer layer not requiring subsequent $HBr/O_2$ or $N_2/H_2$ plasma treatment;
improving selectivity by introducing a depositing gas into the plasma reaction chamber;
the depositing gas being selected from the group consisting of $CH_4$, $CFH_3$, $CH_2F_2$, $C_2H_6$, $C_3H_8$, and $C_4H_{10}$;
mixing the etch gas and the depositing gas prior to introduction to the chamber;
introducing the depositing gas into the chamber separately from the etch gas;
introducing approximately 1% v/v to approximately 99.9% v/v of the depositing gas into the chamber;
activating the plasma by a RF power ranging from approximately 25 W to approximately 10,000 W;
the chamber having a pressure ranging from approximately 1 mTorr to approximately 10 Torr; more preferably the pressure ranging from 50 mtorr to 200 mtorr;
introducing the etch gas to the chamber at a flow rate ranging from approximately 0.1 sccm to approximately 1 slm;
maintaining the substrate at a temperature ranging from approximately −196° C. to approximately 500° C.;
maintaining the substrate at a temperature ranging from approximately −120° C. to approximately 300° C.;
maintaining the substrate at a temperature ranging from approximately −10° C. to approximately 40° C.;

measuring the activated etch gas by Quadropole mass spectrometer, optical emission spectrometer, FTIR, or other radical/ion measurement tool; and generating the plasma being by applying RF power.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 2 is a graph of SiN, $SiO_2$, and poly-Si etch rates versus $O_2$ flow for fluoromethane ($CH_3F$);

FIG. 3 is a graph of SiN, $SiO_2$, and poly-Si etch rates versus $O_2$ flow for fluoroethane ($C_2H_5F$);

FIG. 4 is a graph of SiN, $SiO_2$, and poly-Si etch rates versus $O_2$ flow for 1,1,2-trifluoroethane ($C_2H_3F_3$);

FIG. 5 is a graph of SiN, $SiO_2$, and poly-Si etch rates versus $O_2$ flow for 1-fluoropropane ($C_3H_7F$);

FIG. 6 is a graph of SiN, $SiO_2$, and poly-Si etch rates versus $O_2$ flow for 1,1-difluoropropane ($C_3H_6F_2$);

FIG. 7 is a graph of SiN, $SiO_2$, and poly-Si etch rates versus $O_2$ flow for 1,1,1-trifluoropropane ($C_3H_5F_3$);

FIG. 8 is a graph of SiN, $SiO_2$, and poly-Si etch rates versus $O_2$ flow for 1,2-difluoropropane;

FIG. 9 is a graph of SiN, $SiO_2$, and poly-Si etch rates versus $O_2$ flow for 1,3-difluoropropane;

FIG. 10 is a graph of SiN, $SiO_2$, and poly-Si etch rates versus $O_2$ flow for 2,2-difluoropropane;

FIG. 11 is a scanning electron micrograph (SEM) of the results of a 2 minute SiN etch using 20 sccm $CH_3F$, 50 sccm Ar, 6 sccm $O_2$, at a pressure of 5 Pa and 200 W RF power;

FIG. 12 is a graph of SiN roughness layer thickness versus $O_2$ flow for the same $CH_3F$ etch processes in FIG. 2;

FIG. 13 is a scanning electron micrograph (SEM) of the results of a 2 minute SiN etch using 20 sccm $C_2H_3F_3$, 50 sccm Ar, 12.6 sccm $O_2$, at a pressure of 5 Pa and 200 W RF power;

FIG. 14 is a graph of SiN roughness layer thickness versus $O_2$ flow for the same $C_2H_3F_3$ etch processes in FIG. 4;

FIG. 15 is a scanning electron micrograph (SEM) of the results of a 2 minute SiN etch using 20 sccm $C_3H_7F$, 50 sccm Ar, 23.4 sccm $O_2$, at a pressure of 5 Pa and 200 W RF power;

FIG. 16 is a graph of SiN roughness layer thickness versus $O_2$ flow for the same $CH_3F$ etch processes in FIG. 5;

FIG. 17 is a mass spectrometry (MS) graph plotting the volume of species fractions produced by $CH_3F$ versus energy;

FIG. 18 is a MS graph plotting the volume of species fractions produced by fluoroethane versus energy;

FIG. 19 is a MS graph plotting the volume of species fractions produced by 1,1,2-trifluoroethane versus energy;

FIG. 20 is a MS graph plotting the volume of species fractions produced by 1-fluoropropane versus energy;

FIG. 21 is a MS graph plotting the volume of species fractions produced by 1,1-difluoropropane versus energy;

FIG. 22 is a MS graph plotting the volume of species fractions produced by 2,2-difluoropropane versus energy;

FIG. 23 is a graph of SiN, $SiO_2$, and poly-Si etch rates versus $O_2$ flow for 1-fluorobutane ($C_4H_9F$);

FIG. 24 is is an XPS graph providing the depth profile of a polymer deposited layer from 1-F—$C_3H_7$ on a poly-Si substrate;

FIG. 25 is a graph of SiN, $SiO_2$, and poly-Si etch rates versus $O_2$ flow for fluoromethane ($CH_3F$);

FIG. 26 is a graph of SiN, $SiO_2$, and poly-Si etch rates versus $O_2$ flow for fluoroethane ($C_4H_9F$);

FIG. 27 is a graph of SiN, $SiO_2$, and poly-Si etch rates versus $O_2$ flow for 1-fluoropropane ($C_3H_7F$);

FIG. 28 is a graph of SiN roughness layer thickness versus $O_2$ flow for the same $CH_3F$ etch processes in FIG. 25;

FIG. 29 is a graph of SiN roughness layer thickness versus $O_2$ flow for the same $C_2H_5F$ etch processes in FIG. 26;

FIG. 30 is a graph of SiN roughness layer thickness versus $O_2$ flow for the same 1-F—$C_3H_7$ etch processes in FIG. 27;

DESCRIPTION OF PREFERRED EMBODIMENTS

Figure 1A:
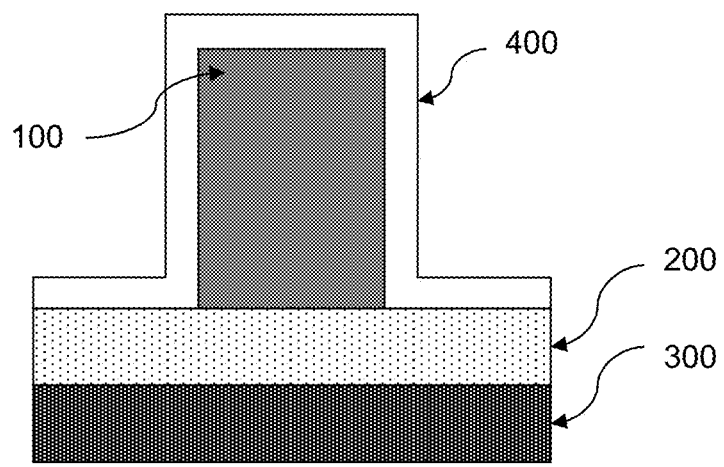
FIG. 1A is a diagram showing the exemplary layer of silicon nitride on a substrate.

Etch gases for improved silicon nitride plasma etching methods are disclosed. The disclosed etch gases fully etch the SiN layers from a substrate without generating a large SiN roughness layer. The disclosed etch gases also provide improved selectivity to substrate materials.

The disclosed plasma etch gases provide improved selectivity between the silicon nitride layers and substrate materials. Additionally, the disclosed plasma etch gases etch the silicon nitride layers while maintaining very low surface roughness. The disclosed plasma etch gases also provide protection from damage to substrate materials by formation of a polymer layer.

The disclosed plasma etch gases have the formula $C_xH_yF_z$, wherein x is 2-5, z is 1 or 2, 2x+2=y+z, and a fluorine atom is located on a terminal carbon atom of the etch gas. Exemplary etch gases include fluoroethane; 1-fluoropropane; 1,1-difluoropropane; 1,2-difluoropropane, 1-fluorobutane, 1,1-fluorobutane, 1,2-difluorobutane, 1-fluoropentane, 1,1-difluoropentane, 1,2-difluoropentane, and combinations thereof. For example, the plasma etch gas may include a combination of 1-fluoroethane with 1-fluoropropane or 1-fluoropropane with 1-fluorobutane. These compounds are commercially available. Even though some of these compounds have the same molecular formula (i.e., $C_3H_6F_2$), each isomer has different bonding structure and therefore may produce different fragmentation in the plasma, resulting in different etching or deposition species.

As shown in the examples that follow, some of the prior art etch gases generate large SiN roughness layers, resulting in an uneven etch process. The rough SiN layer may permit exposure of the underlying substrate to more physical plasma damage and/or chemical damage. For example, the uneven SiN layer may permit penetration of carbon and oxygen into the substrate, which may form parasitic carbide or oxide layers, which may prevent epitaxial silicon growth in the next source/drain contact processing step. Additionally, the uneven SiN layer results in formation of an uneven polymer protection layer during the etch process. The rough SiN layers may also require longer SiN etch processing time, potentially exposing the underlying layer to more damage from the plasma process. Any chemical or physical damage to the substrate will degrade device performance.

Applicants have discovered that the fluorine atom located on the terminal carbon atom of the etch gas provides a larger process range with infinite SiN:substrate selectivity and low SiN roughness during the SiN etch process. Applicants believe that etch gases with the F on the terminal C produces hydrogen rich $C_2$ and/or $C_3$ and/or $C_4$ fragments in the plasma which are beneficial because these fragments produce less damage to the underlying substrate when compared to F rich fragments. More particularly, because plasma treatment of these etch gases produce fragments containing longer alkyl chains than the commercially used etch gas, $CH_3F$, Applicants believe protective polymer layers will be deposited on the substrate rather than being implanted as carbon into the substrate.

The disclosed plasma etch gases are provided at between approximately 99.9% by volume and approximately 100.0% by volume purity, preferably between approximately 99.99% by volume and approximately 100.00% by volume purity, and more preferably between approximately 99.999% by volume and approximately 100.000% by volume purity. The disclosed etch gases contain between approximately 0.0% by volume and approximately 0.1% by volume trace gas impurities with between approximately 0 ppm by volume to approximately 150 ppm by volume of nitrogen-containing and oxygen-containing gases, such as $N_2$ and/or $H_2O$ and/or $CO_2$ and/or CO, and/or $SO_2$ contained in said trace gaseous impurities. Preferably, the water content in the plasma etch gas is between approximately 0 ppm by weight and approximately 20 ppm by weight. The purified product may be produced by distillation and/or passing the gas or liquid through a suitable adsorbent, such as a 4A molecular sieve.

In one alternative the disclosed plasma etch gas contains between approximately 0% by volume and approximately 5% by volume, preferably between approximately 0% by volume and approximately 1% by volume, more preferably between approximately 0.0% by volume and approximately 0.1% by volume, and even more preferably between approximately 0.00% by volume and approximately 0.01% by volume of any of its isomers. This alternative may provide better process repeatability. This alternative may be produced by distillation of the gas or liquid. Alternatively, the disclosed plasma etch gas may contain between approximately 5% by volume and approximately 50% by volume of one or more of its isomers, particularly when the isomer mixture provides improved process parameters or isolation of the target isomer is too difficult or expensive. For example, a mixture of isomers may reduce the need for two or more gas lines to the plasma reactor. One exemplary mixture may combine 50% by volume 1,1-$C_3H_6F_2$ with 50% by volume 1,2-$C_3H_6F_2$ or 90% 1,1-$C_4H_8F_2$ with 10% 1,2-$C_4H_8F_2$.

The disclosed compounds are suitable for plasma etching silicon nitride layers used as gate spacer layers, because they induce little to no damage on underlying substrate materials. In order to achieve those properties, the hydrogen rich etch gas may deposit an etch-resistant polymer layer during etching and help reduce the direct impact of the oxygen and fluorine radicals during the etching process. Preferably, the hydrogen rich etch gas is both suitably volatile and stable during the etching process for delivery into the reactor/chamber.

The disclosed etch gases plasma etch silicon nitride layers on a substrate. The disclosed plasma etching method may be useful in the manufacture of semiconductor devices such as FinFET or FD-SOI. The other areas of applications include its use in different front end of the line (FEOL).

The disclosed plasma etch gases minimize formation of a SiN roughness layer on the substrate during the plasma etch process. More particularly, by simultaneously introducing the disclosed etch gases and an oxidizer at a predetermined flow rate into a plasma reaction chamber containing the substrate, the disclosed methods generate a SiN roughness layer between approximately 0 nm and 10 nm thick on the substrate.

The plasma reaction chamber may be any enclosure or chamber within a device in which etching methods take place such as, and without limitation, Reactive Ion Etching (RIE), Dual Capacitively Coupled Plasma with single or multiple frequency RF sources, Inductively Coupled Plasma (ICP), Remote Plasma, Pulsed Plasma, or Microwave Plasma reactors, or other types of etching systems capable of selectively removing a portion of the silicon nitride layer or generating active species. One of ordinary skill in the art will recognize that the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher Dielectric etch product family sold under the trademark 2300® Flex™.

The plasma reaction chamber may contain one or more than one substrate. A substrate is generally defined as the material on which a process is conducted. For example, the plasma reaction chamber may contain from 1 to 200 silicon wafers having from 25.4 mm to 450 mm diameters. The one or more substrates may be any suitable substrate used in semiconductor, photovoltaic, flat panel or LCD-TFT device manufacturing. Typically the substrate will be a patterned substrate having multiple layers thereon. Examples of suitable layers include without limitation silicon (such as amorphous silicon, polysilicon (aka Poly-Si), crystalline silicon, any of which may further be p-doped or n-doped), silica, silicon nitride, silicon oxide, silicon oxynitride, tungsten, titanium nitride, tantalum nitride, mask materials such as amorphous carbon, antireflective coatings, photoresist materials, or combinations thereof. Additionally, layers comprising tungsten or noble metals (e.g. platinum, palladium, rhodium or gold) may be used. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

For example, the substrate may form a silicon nitride gate spacer similar to the structure shown in FIG. 1A. In FIG. 1A, a silicon nitride layer 400 is deposited on a gate structure 100 and silicon layer 200, all located on a buried oxide silicon wafer 300. The silicon nitride layer 400 may include only Si and N atoms in a 1:1 ratio. Alternatively, the silicon nitride layer 400 may include only Si and N atoms in a 3:4 ratio. In another alternative, the SiN layer 400 may include only Si and N atoms in a ratio of 1 Si to 0.05 to 0.95N. In yet another alternative, the SiN layer 400 may include other atoms, such as oxygen, carbon, or boron, to form $SiO_aN_b$, $SiC_cN_b$, $SiO_aC_cN_b$, or $SiB_dC_cN_b$, wherein each of a, b, c, and d independently range from approximately 0.05 to approximately 0.95. The silicon nitride layer 400 may be between approximately 2 and approximately 50 nm thick. The gate structure 100 may include any of the standard layers used to form gate structures, such as dielectric and electrode layers. In one example, the top of the gate structure 100 in direct contact with the silicon nitride layer 400 is a silicon oxide dielectric layer.

Figure 1B:
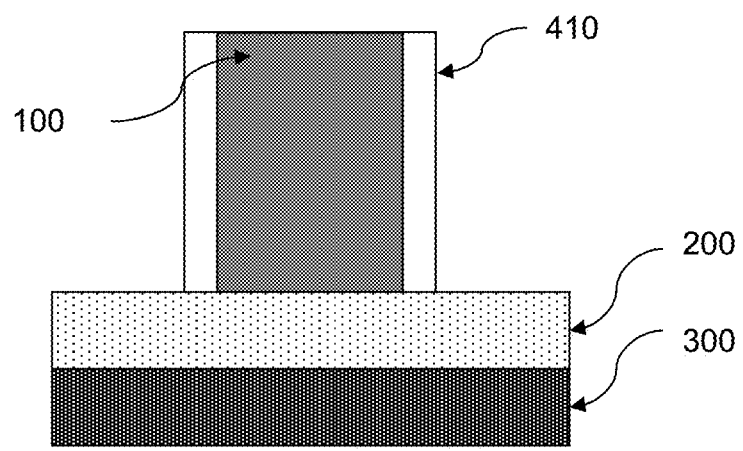
FIG. 1B is a diagram showing the exemplary layer of silicon nitride on a substrate after the disclosed etch process.

A schematic of the structure after exposure to the disclosed etch process is provided in FIG. 1B. The disclosed etch process is anisotropic and selective to the silicon nitride layer 400. Therefore, the remaining vertical silicon nitride layer 410 may be used as a gate spacer. The gate structure 100, the silicon layer 200, and the buried oxide layer 300 remain unaltered due to the infinite silicon nitride to substrate selectivity of the processes disclosed herein.

The etch gas is introduced into the chamber containing the substrate and silicon nitride layers. The etch gas may be introduced to the chamber at a flow rate ranging from approximately 0.1 sccm to approximately 1 slm. For example, for a 200 mm wafer size, the etch gas may be introduced to the chamber at a flow rate ranging from approximately 5 sccm to approximately 50 sccm. Alternatively, for a 450 mm wafer size, the etch gas may be introduced to the chamber at a flow rate ranging from approximately 25 sccm to approximately 250 sccm. One of ordinary skill in the art will recognize that the flow rate will vary from tool to tool.

Some of the disclosed etch gases may be liquids at standard temperature and pressure. One of ordinary skill in the art will recognize how to convert the liquid to gas form for introduction into the chamber. For example, the liquid may be vaporized through direct vaporization, distillation, direct liquid injection, or by bubbling. The liquid may be fed to a vaporizer where it is vaporized before it is introduced into the reactor. Alternatively, the liquid may be vaporized by passing a carrier gas into a container containing the compound or by bubbling the carrier gas into the compound. The carrier gas may include, but is not limited to, Ar, He, $N_2$, and mixtures thereof. Bubbling with a carrier gas may also remove any dissolved oxygen present in the neat or blended compound solution. The carrier gas and compound are then introduced into the reactor in gaseous form.

An oxidizer, such as $O_2$, $O_3$, CO, $CO_2$, NO, $N_2O$, $NO_2$, $SO_2$, and combinations thereof, is simultaneously introduced at a predetermined flow rate into the plasma reaction chamber with the etch gas. The etch gas and the oxidizer may be mixed together prior to introduction into the chamber. Alternatively, the oxidizer may be introduced continuously into the chamber and the etch gas introduced into the chamber in pulses. The oxidizer may comprise between approximately 5% by volume to approximately 100% by volume of the mixture introduced into the chamber (with 100% by volume representing introduction of pure oxidizer for the continuous introduction alternative).

Applicants have surprisingly discovered that varying the oxidant flow rate in the nitride etch process results in two different phenomena. The oxidant flow rate may be optimized to produce infinite selectively between SiN and the underlying substrate and/or surrounding layers. The oxidant flow rate may also be optimized to minimize roughness in the SiN layer. As illustrated in the examples that follow, the oxidant flow rates for these two phenomena do not overlap for all SiN etch gases. Applicants believe that having one F on a terminal carbon of the etch gas permits wider oxidant flow rate windows for both phenomena, providing overlap of the two, and improved SiN etch processes.

The disclosed processes selectively etch the SiN layer without etching the underlying substrate and/or any other exposed non-SiN layers on the substrate. Infinite selectivity occurs when the etch rate of SiN is a positive number and the etch rate of the substrate occurs at a negligible rate that is approximately 0 nm/min or any negative etch rate (i.e., deposition of polymer). The present application makes no distinction between an etch rate of 0 nm/min and deposition of polymer. Variations in film thickness measurement techniques, instrument variation, topographical variations in the substrate, and natural fluctuations such as machine noise or uncontrollable variations may periodically lead to some measured substrate etch rates greater than 0 nm/min. For the purpose of this disclose, a substrate etch rate of 0 or "without etching" means a measured etch rate equal to or less than 0 nm/min or a measured etch rate greater than 0 nm/min but less than the precision of the film thickness measurement technique.

One of ordinary skill in the art will recognize that a process providing infinite selectivity is important because it permits removal of the SiN layer without affecting the surrounding or underlying layers. Many SiN etch processes are performed longer than necessary to ensure complete removal of the SiN layer. For example, a 10 nm SiN layer may be etched for the amount of time necessary to remove a 13 nm SiN layer just to ensure that no SiN remains on the substrate. Obviously, as a result, the underlying substrate is subject to the potential for more damage in such a process.

SiN etching with some prior art SiN etch gases produces a rough SiN layer, similar to those shown in FIGS. 11 and 13 of Example 5. The rough SiN layer may expose the underlying substrate to plasma damage and/or chemical damage. Additionally, the uneven SiN layer results in an uneven polymer protection layer during the etch process. The rough SiN layers may also require longer SiN etch processing times in order to completely remove the SiN layer, potentially exposing the underlying layer to more damage during the plasma process.

One of ordinary skill in the art will recognize that the predetermined oxidant flow rate will vary amongst plasma reaction chambers. The predetermined flow rate may be calculated by optical or surface topography analysis of a substrate having a partial SiN layer deposited thereon during the etch process to determine an oxidizer flow rate that (a) etches the SiN layer, (b) does not etch the substrate, and (c) does not generate a SiN roughness layer greater than 10 nm thick. The analysis may be performed by any device having sufficient resolution to view nanometer sized structures in the 0-10 nm range. Exemplary surface topography analysis devices include, but are not limited to, atomic force microscopes. Exemplary optical analysis devices include, but are not limited to, variable angle spectroscopic ellipsometers, scanning electron microscopes, and transmission electron microscopes. The partial SiN layer may be deposited on and/or surrounded by a substrate of a differing material. For example, the SiN layer may be deposited on a polysilicon layer and surrounded by a silicon dioxide layer. The etch process may be repeated at varying oxidant flow rates until an oxidant flow rate is determined that successfully etches the SiN layer to low roughness and fails to etch the underlying polysilicon and/or surrounding silicon dioxide layers.

Alternatively, etch rates may be plotted to determine when the oxidant flow rates producing infinite selectivity overlap those producing low SiN roughness. More particularly, the range of oxidant flow rates producing infinite selectivity may be determined by plotting the SiN etch rate on a Y axis versus oxidizer flow rate on a X axis and plotting the substrate etch rate for the etch gas on a Y axis versus oxidizer flow rate on a X axis. One of ordinary skill in the art will recognize that infinite selectivity occurs in the range of oxidant flow rates in which SiN has a positive etch rate and the substrate has no etch rate (i.e., 0 nm/minute or any deposition of polymer—the deposition of polymer is sometimes shown as a negative etch rate). As shown in the Examples that follow, experimental results indicate that low SiN roughness (i.e., etching that leaves a SiN roughness layer between approximately 0 nm and approximately 10 nm thick) correlates to the SiN etch rate reaching a plateau on a plot of etch rate on the Y axis versus oxidizer flow rate on the X axis [i.e., when the SiN etch rate remains approximately the same (±10%, preferably ±5%) with increasing oxidant flow rate]. The predetermined oxidant flow rate may be selected from points on the graph having a substrate etch rate equal to or less than 0 nm/minute and a slope of the SiN etch rate of approximately 0.

An inert gas is also introduced into the reactor in order to sustain the plasma. The inert gas may be He, Ar, Xe, Kr, Ne, or combinations thereof. The etch gas and the inert gas may be mixed prior to introduction to the chamber, with the inert gas comprising between approximately 50% by volume and approximately 95% by volume of the resulting mixture. Alternatively, the inert gas may be introduced to the chamber continuously while the etch gas is introduced to the chamber in pulses.

The etch gas, oxidizer and inert gas are activated by plasma. The plasma decomposes the etch gas and oxidizer into radical form. The plasma may be generated by applying RF or DC power. The plasma may be generated with a RF power ranging from about 25 W to about 10,000 W. The plasma may be generated or present within the reactor itself. Alternatively, a remotely located plasma system may be used. The plasma may be generated in Dual CCP or ICP mode with RF applied at both electrodes. RF frequency of plasma may range from 200 KHz to 1 GHz. Different RF sources at different frequency can be coupled and applied at same electrode. Plasma RF pulsing may be further used to control molecule fragmentation and reaction at substrate. One of skill in the art will recognize methods and apparatus suitable for such plasma treatment.

Quadrupole mass spectrometer, optical emission spectrometer, FTIR, or other radical/ion measurement tools may measure the activated etch gas to determine the types and numbers of species produced. If necessary, the flow rate of the etch gas, oxygen, and/or the inert gas may be adjusted to increase or decrease the number of radical species produced.

The disclosed etch gases may be mixed with other gases either prior to introduction into the reaction chamber or inside the reaction chamber. Preferably, the gases may be mixed prior to introduction to the chamber in order to provide a uniform concentration of the entering gas. In another alternative, the etch gas may be introduced into the chamber independently of the other gases such as when two or more of the gases react.

Other exemplary gases with which the etch gases may be mixed include additional etch gases, such as $CF_4$, $CH_3F$, $CH_2F_2$, and $CHF_3$. The two gases may be mixed prior to introduction to the chamber. The etch gas may comprise between approximately 1% by volume to approximately 99.9% by volume of the mixture introduced into the chamber.

Other exemplary gases with which the etch gases may be mixed include additional deposition gases, such as $CH_4$, $C_2H_6$, $C_3H_8$, and $NH_3$. The etch gas and the deposition gas may be mixed prior to introduction to the chamber. The etch gas may comprise between approximately 1% by volume to approximately 99.9% by volume of the mixture introduced into the chamber.

The silicon nitride layers and the activated etch gas react to form volatile species that are removed from the reactor. At the predetermined oxidant flow rates, the silicon oxide and silicon are less reactive, and preferably non-reactive, to the etch gas.

The temperature and the pressure within the reactor are held at conditions suitable for the silicon nitride layer to react with the activated etch gas. For instance, the pressure in the reactor may be held between approximately 0.1 mTorr and approximately 1000 Torr, preferably between approximately 1 mTorr and approximately 10 Torr, more preferably between approximately 50 mTorr and approximately 500 mTorr, and more preferably between approximately 50 mTorr and approximately 200 mTorr, as required per the etching parameters. Likewise, the substrate temperature in the reactor may range between about approximately −196° C. to approximately 500° C., preferably between −120° C. to approximately 300° C., and more preferably between −10° C. to approximately 40° C. Chamber wall temperatures may range from approximately −196° C. to approximately 300° C. depending on the process requirements.

The reactions between the silicon nitride layer and the plasma activated etch gas results in removal of the silicon nitride layer from the substrate. Atoms of oxygen and/or carbon and/or boron may also be present in the silicon nitride layer. The removal is due to a physical sputtering of the silicon nitride layer from plasma ions (accelerated by the plasma) and/or by chemical reaction of plasma species to convert SiN to volatile by-products, such as $SiF_x$, wherein x ranges from 1-4, and HCN. The physically sputtered materials and/or volatile by-products may be removed from the reaction chamber via vacuum.

The plasma activated etch gas preferably exhibits high selectivity toward the substrate and etches SiN anisotropically which is important for gate spacer applications. The plasma activated etch gas preferably selectively etches SiN over the underlying substrate material, such as silicon, silicon oxide, poly-silicon, SiGe, GaAs, InGaAs, or InP.

The silicon nitride etching process may be stopped when the underlying substrate begins to accumulate polymer deposition. Alternatively, the concentration of volatile by-products in the chamber effluent may be analyzed and the etch process stopped when generation of the volatile by-products ceases.

Figure 35:
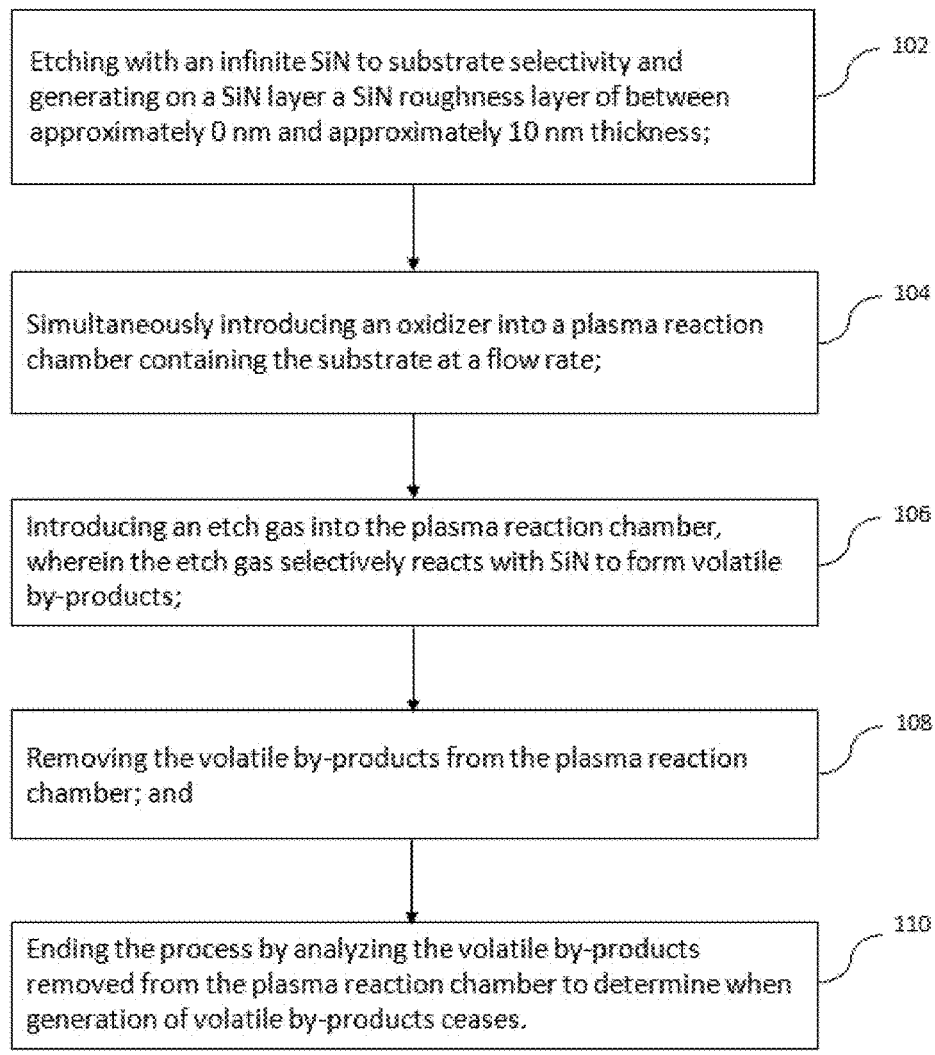
FIG. 35 is a flowchart for the disclosed etching process.

FIG. 35 is a flowchart for the disclosed etching process. At step 102, a substrate is etched with an infinite SiN to substrate selectivity and a SiN roughness layer of between approximately 0 nm and approximately 10 nm thickness is generated on a SiN layer of the substrate. Simultaneously, at step 104, an oxidizer is introduced into a plasma reaction chamber containing the substrate at a flow rate. Then an etch gas is introduced into the plasma reaction chamber, wherein the etch gas selectively reacts with SiN to form volatile by-products at step 106. The etch gas selectively reacts with SiN to form volatile by-products in the plasma reaction chamber. The volatile by-products is then removed from the plasma reaction chamber at step 108. At step 110, the etching process may be ended by analyzing the volatile by-products removed from the plasma reaction chamber to determine when generation of the volatile by-products ceases.

The disclosed etch processes using the etch gases to etch silicon nitride layers maintains the physical and chemical integrity of the underlying substrate material. The underlying substrate material may have a protecting polymer layer as a result of the etch process. The protecting polymer layer may act as a barrier to etching or damage of the underlying substrate material from plasma species.

As shown in the examples that follow, the disclosed etch gases enjoy a wide oxidant flow rate process window that provides infinite SiN:substrate selectivity and generates small SiN roughness layers during the etch process. Applicants believe that generating smaller SiN roughness layers during the etch process better protects the underlying substrate from plasma damage and carbon implantation, which may prevent the necessity of additional processing steps, such as HBr/O$_2$ or N$_2$/H plasma, prior to the silicon epitaxy step.

In one non-limiting exemplary plasma etch process, the vapor of C$_2$H$_5$F is introduced into a 200 mm Reactive Ion Etch plasma etch tool using a controlled gas flow device. The pressure of the plasma etch tool is set at approximately 30 mTorr. No gas source heating is necessary, as the vapor pressure of this compound is approximately 5600 torr at room temperature. The electrode RF power is fixed at 200 W. The plasma etch tool includes a chamber containing a substrate having silicon nitride layers thereon. Argon is independently introduced into the chamber at a 50 sccm flow rate. C$_2$H$_5$F is independently introduced into the chamber at 20 sccm. O$_2$ is independently introduced into the chamber at 0-30 sccm to determine optimum etching conditions.

EXAMPLES

The following non-limiting examples are provided to further illustrate embodiments of the invention. However, the examples are not intended to be all inclusive and are not intended to limit the scope of the inventions described herein.

The following testing was performed using a SAMCO10-NR reactive ion etcher (RIE). Samples were cleaved into 1×1 cm2 from 200 mm wafers with blanket films of SiN, polysilicon (poly-Si), and TEOS. The blanket film thickness was measured on a variable angle spectroscopic ellipsometer. Film thickness was approximately 270 nm for SiN, 300 nm for poly-Si, and 2000 nm for TEOS. The samples were loaded into a 200 mm plasma chamber and placed on top of the RF powered electrode. No heating or cooling was applied to the substrate. The chamber was evacuated to ~10$^{-2}$ Pa. The Ar, O$_2$, and etch gas were then simultaneously introduced into the chamber at predetermined flow rates through separate gas lines. The gases were allowed to equilibrate in the plasma chamber at a pressure of 5 Pa. The plasma was then turned on using an RF power ranging from 50 W to 200 W and the process duration was 2 minutes. The process time was chosen so that a portion of each film was removed and could be measured using the above mentioned ellipsometer.

Example 1

Etch data using C$_2$H$_5$F and C$_2$H$_3$F$_3$ gases were analyzed with respect to CH$_3$F etch data. All etch data was collected under 200 W plasma RF power. The data serves as a comparison for molecules with H:F>1 versus H:F≤1. A graph of the SiN, SiO$_2$, and poly-Si etch rates versus O$_2$ flow (in standard cubic centimeters per minute (sccm)) for fluoromethane (CH$_3$F) is shown in FIG. 2. A graph of the SiN, SiO$_2$ and poly-Si etch rates versus O$_2$ flow for fluoroethane (C$_2$H$_5$F) is shown in FIG. 3. A graph of the SiN, SiO$_2$, and poly-Si etch rates versus O$_2$ flow for 1,1,2-trifluoroethane (C$_2$H$_3$F$_3$) is shown in FIG. 4. In FIGS. 2-10, as illustrated by the circle and arrow, the SiN etch rate (in nm/min) is provided on the left Y axis and the SiO$_2$ and Poly-Si etch rates (in nm/min) are provided on the right Y axis. Additionally, in FIGS. 2-10, the SiO$_2$ etch rate is labeled as TEOS because the SiO$_2$ film was deposited from the tetraethyl orthosilicate precursor.

The higher H:F ratio for C$_2$H$_5$F yields a larger infinite selectivity range (ISR) relative to CH$_3$F. The ISR is defined as the range of O$_2$ flow (in sccm) where infinite SiN to poly-Si selectivity is obtained. Infinite SiN to poly-Si selectivity occurs when SiN etches and poly-Si does not etch or SiN etches and poly-Si accumulates polymer deposits. There is no distinction between an etch rate of 0 nm/min and deposition of polymer for the data presented in FIGS. 2-10. In FIG. 2, the ISR for CH$_3$F ranges from approximately 5.4 sccm O$_2$ through approximately 6.6 sccm O$_2$. In FIG. 3, the ISR for C$_2$H$_5$F for ranges from approximately 7.2 sccm O$_2$ through approximately 10.2 sccm O$_2$. The SiN etch rate is also larger for C$_2$H$_5$F in the infinite selectivity range.

C$_2$H$_3$F$_3$ has a lower H:F ratio and lower infinite selectivity range relative to CH$_3$F. In FIG. 4, the ISR for C$_2$H$_3$F$_3$ ranges from approximately 12.0 sccm O$_2$ through approximately 12.6 sccm O$_2$.

The calculated ISR values are presented in Table 1 in Example 8.

Example 2

Etch data using C$_3$H$_7$F (1-fluoropropane), C$_3$H$_6$F$_2$ (1,1-difluoropropane), and C$_3$H$_5$F$_3$ (1,1,1-trifluoropropane) gases were analyzed. All etch data was collected under 200 W plasma RF power. The data serves as a comparison of F content on a terminal carbon in C3 molecules. The graph of the SiN, SiO$_2$, and poly-Si etch rates versus O$_2$ flow (in sccm) for fluoropropane (C$_3$H$_7$F) is shown in FIG. 5. The graph of the SiN, SiO$_2$ and poly-Si etch rates versus O$_2$ flow (in sccm) for 1,1-difluoropropane (C$_3$H$_6$F$_2$) is shown in FIG. 6. The graph of the SiN, SiO$_2$ and poly-Si etch rates versus O$_2$ flow (in sccm) for 1,1,1-trifluoropropane (C$_3$H$_5$F$_3$) is shown in FIG. 7. The Process Window (defined as the oxygen flow rates producing infinite selectivity and a roughness layer <10 nm thick) decreases in the order C$_3$H$_7$F>C$_3$H$_6$F$_2$>C$_3$H$_5$F$_3$. The data show that increasing F atoms on one terminal carbon significantly reduces the Process Window. Only minor differences are observed in maximum SiN etch rate.

In FIG. 5, the ISR for C$_3$H$_7$F ranges from approximately 18.6 sccm O$_2$ to 24 sccm O$_2$. In FIG. 6, the ISR for C$_3$H$_6$F$_2$ ranges from approximately 24 sccm O$_2$ to 30 sccm O$_2$. In FIG. 7, the ISR for C$_3$H$_5$F$_3$ ranges from approximately 19.8 sccm O$_2$ to 22.8 sccm O$_2$. The calculated ISR values are presented in Table 1 in Example 8.

Example 3

Etch data using C$_3$H$_6$F$_2$ (1,1-difluoropropane), C$_3$H$_6$F$_2$ (1,2-difluoropropane), C$_3$H$_6$F$_2$ (1,3-difluoropropane), and C$_3$H$_6$F$_2$ (2,2-difluoropropane) were analyzed. All etch data was collected under 200 W plasma RF power. The data compares isomers to demonstrate the importance of F atom location in the etch gas molecule structure. A graph of the SiN, SiO$_2$ and poly-Si etch rates versus O$_2$ flow (in sccm) for 1,1-difluoropropane (C$_3$H$_6$F$_2$) is shown in FIG. 6. A graph of the SiN, SiO$_2$ and poly-Si etch rates versus O$_2$ flow (in sccm) for 1,2-difluoropropane (C$_3$H$_6$F$_2$) is shown in FIG. 8. In FIG. 8, the ISR for 1,2-difluoropropane ranges from approximately 24 sccm O$_2$ to 29.4 sccm O$_2$. A graph of the SiN, SiO$_2$ and poly-Si etch rates versus O$_2$ flow (in sccm) for 1,3-difluoropropane (C$_3$H$_6$F$_2$) is shown in FIG. 9. In FIG. 9, the ISR for 1,3-difluoropropane ranges from approximately 24 sccm $O_2$ to 28.2 sccm $O_2$. A graph of the SiN, $SiO_2$ and poly-Si etch rates versus $O_2$ flow (in sccm) for 2,2-difluoropropane ($C_3H_6F_2$) is shown in FIG. 10. In FIG. 10, the ISR for 2,2-difluoropropane ranges from approximately 15 sccm $O_2$ to 18.6 sccm $O_2$. There is a noticeable progression of diminishing infinite selectivity ranges in the order 1,1-difluoropropane>1,2-difluoropropane>1,3-difluoropropane, >2,2-difluoropropane. The calculated values are presented in Table 1 in Example 8. The data shows that $C_3$ molecules with more than one F atom yield larger infinite selectivity ranges when the F atoms are on one terminal carbon.

Example 4

Etch data using $C_2H_5F$, 1-$C_3H_7F$ (1-fluoropropane), and 1-$C_4H_9F$ (1-fluorobutane) were analyzed. All etch data was collected under 200 W plasma RF power. The data compares the effect of longer $C_xH_y$ (where y=2x+1) branches on HFC molecules with a single F atom on a terminal carbon. A graph of the SiN, $SiO_2$ and poly-Si etch rates versus $O_2$ flow (in sccm) for fluoroethane ($C_2H_5F$) is shown in FIG. 3. A graph of the SiN, $SiO_2$ and poly-Si etch rates versus $O_2$ flow (in sccm) for 1-fluoropropane ($C_3H_7F$) is shown in FIG. 5. A graph of the SiN, $SiO_2$ and poly-Si etch rates versus $O_2$ flow (in sccm) for 1-fluorobutane ($C_4H_9F$) is shown in FIG. 23. In FIG. 23, the ISR for 1-fluorobutane ranges from approximately 31.8 sccm $O_2$ to 37.8 sccm $O_2$. There is a noticeable progression of increasing infinite selectivity ranges in the order fluoroethane<1-fluoropropane<1-fluorobutane. The calculated values are presented in Table 1 in Example 8. The data shows that HFC molecules with one F atom on a terminal carbon have improved etch performance as the $C_xH_y$ (where y=2x+1) branch increases.

Example 5

A comparison of roughness on SiN layers etched with $CH_3F$ and $C_3H_7F$ were analyzed. Infinite SiN to poly-Si selectivity is obtained using flow rates of 50 sccm Ar, 30 sccm $CH_3F$, and 6 sccm $O_2$, with a 200 W plasma, and pressure of 5 Pa. After etching under these conditions, the SiN surface has a thick roughness layer (~82 nm), as shown in FIG. 11. The roughness layer thicknesses for each etch condition in FIG. 2 is plotted in FIG. 12.

Infinite SiN to poly-Si selectivity is obtained using flow rates of 50 sccm Ar, 20 sccm $C_2H_3F_3$, and 12.6 sccm O2, with a 200 W plasma, and pressure of 5 Pa. After etching under these conditions, the SiN surface has a thick roughness layer (~82 nm), as shown in FIG. 13. The roughness layer thicknesses for each etch condition in FIG. 4 is plotted in FIG. 14.

Infinite SiN to poly-Si selectivity is obtained using flow rates of 50 sccm Ar, 20 sccm $C_3H_7F$, and 23.4 sccm $O_2$, with a 200 W plasma, and pressure of 5 Pa. After etching under these conditions, the SiN surface remains smooth, as shown in FIG. 15. Any surface roughness layer on the SiN following the $C_3H_7F$ etch process is small enough that it is not easily measured by the SEM cross section. The roughness layer thicknesses for each etch condition in FIG. 5 is plotted in FIG. 16.

The roughness layer on etched SiN is consistently lower in the infinite selectivity range for $C_3H_7F$ relative to $CH_3F$ and 1,1,2-$C_2H_3F_3$. Surface roughness on etched SiN gate spacer layers is not desirable because the uneven removal of the SiN layer may result in more damage to the underlying layer. The disclosed etch gases combined with the disclosed oxygen flow rates provide both infinite selectivity and a roughness layer <10 nm thick in the SAMCO10-NR reactive ion etcher, defined as the Process Window in Table 1 in Example 8. One of ordinary skill in the art will recognize that the oxygen flow rates producing both infinite selectivity and a roughness layer <10 nm thick will vary depending on the piece of equipment utilized.

Example 6

Fluoromethane, fluoroethane, 1,1,1-trifluoroethane, 1-fluoropropane, 1,1-difluoropropane, and 2,2-difluoropropane were directly injected into a quadrupole mass spectrometer (QMS) and data collected from 10-100 eV. The results are shown in FIGS. 17, 18, 19, 20, 21, and 22, respectively. Fragments from $C_2H_5F$, $C_3H_7F$, and $C_3H_6F_2$ (1,1-difluoropropane) have higher H:F ratio than the fragments from $CH_3F$, 1,1,2-trifluoroethane, and 2,2-difluoropropane. The dominant fragment for $C_3H_7F$ and $C_3H_6F_2$ (1,1-difluoropropane) is $C_2H_5$. The fragmentation patterns for these molecules suggest that hydrofluorocarbons with hydrogen saturated carbon branches create dense polymers on the substrate material which prevents etching or damage of the underlying substrate from the plasma species.

Example 7

Polymers were deposited by introduction into a RIE plasma reaction chamber at 10 sccm in the absence of other gases. The pressure in the chamber was set at 5 Pa. The plasma was set at 200 W. Deposition was performed on crystalline silicon substrates. Polymers were deposited from $CH_3F$ at 23 nm/min. Polymers were deposited from $C_2H_5F$, $C_2H_3F_3$, $C_3H_7F$, and $C_3H_6F_2$ at 41 nm/min, 66 nm/min, 53 nm/min, and 45 nm/min respectively.

Example 8

The following table (Table 1) summarizes the test results from the examples above for multiple etch gases:

TABLE 1

| Molecule[1] | ISR[3] | PW[4] | 1$^{st}$ fragment at 20 eV | 2$^{nd}$ fragment at 20 eV | Dep Rate (nm/min)[2] |
|---|---|---|---|---|---|
| $CH_3F$ | 1.8 | 0 | $CH_2F$ | $CH_3F$ | 23 |
| $C_2H_5F$ | 3.6 | 3.6 | $C_2H_4F$ | $CH_2F$ | 41 |
| $C_2H_3F_3$ | 0.6 | 0 | $CHF_2$ | $CH_2F$ | 66 |
| $C_3H_7F$ | 5.4 | 4.8 | $C_2H_5$ | $C_2H_4$ | 53 |
| 1,1-$C_3H_6F_2$ | 6 | 3.6 | $C_2H_5$ | $C_3H_5F$ | 45 |
| 1,2-$C_3H_6F_2$ | 5.4 | 3.6 | $C_2H_4F$ | $C_2H_3F$ | 55 |
| 1,3-$C_3H_6F_2$ | 4.2 | 2.4 | $C_2H_4F$ | $C_3H_4F$ | 55 |
| 2,2-$C_3H_6F_2$ | 3.6 | 1.2 | $C_2H_3F_2$ | $C_2H_2F_2$ | 44 |
| 1,1,1-$C_3H_5F_3$ | 3 | 1.2 | $C_2H_5$ | $C_3H4F_2$ | 49 |
| $C_4H_9F$ | 6 | 6 | $C_3H_7$ | $C_4H_8$ | 66 |

Based on these results, the largest infinite selectivity ranges are obtained with high H:F ratio molecules. One of ordinary skill in the art will recognize, and as is further evident from the figures, that the order of fragment may differ at different energies. Among the high H:F ratio molecules, isomers which dissociate with a high density of $C_xH_y$ fragments have the largest infinite selectivity ranges. This suggests the preferred etch gas formula is $C_xH_yF_z$ where z<3 and all F atoms are located on one terminal carbon. The polymer deposition rates do not correlate with the infinite selectivity ranges since $C_2H_3F_3$ has the highest deposition rate, but the lowest infinite selectivity range. The PW column shows that roughness significantly influences the desired process range for lower H:F ratio molecules.

[1]$C_2H_3F_3$=1,1,2-trifluoroethane; $C_3H_7F$=1-fluoropropane; 1,1-$C_3H_6F_2$=1,1-difluoropropane; 1,2-$C_3H_6F_2$=1,2-difluoropropane; 1,3-$C_3H_6F_2$=1,3-difluoropropane; 2,2-$C_3H_6F_2$=2,2-difluoropropane; 1,1,1-$C_3H_5F_3$=1,1,1-trifluoropropane; $C_4H_9F$=1-fluorobutane
[2]10 sccm etching gas, 5 Pa and 200 W
[3]ISR=Infinite selectivity range
[4]PW=Process Window=Range with infinite selectivity and less than 10 nm thick roughness layer

Example 9

FIG. 24 is an XPS graph providing the depth profile of a polymer deposited layer on a poly-Si substrate. The polymer layer was deposited on poly-Si by operating a 1-fluoropropane plasma with the following conditions: 20 sccm 1-fluoropropane, 22.2 sccm $O_2$, 50 sccm Ar, 200 W RF power, 5 Pa process pressure, 2 minutes process duration. This set of process conditions yields a SiN etch rate of approximately 56 nm/min and a SiN roughness layer of approximately 3 nm. Therefore, this process condition lies within the PW for 1-fluoropropane.

The XPS depth profile was obtained by monatomic Ar sputtering and high resolution scanning of the Si, F, O, and C energy regions. The sputter depth was calculated from a sputter rate of ~8 nm/min. The C—Si data is calculated from an auto-assigned peak at 283.02 eV. This energy is consistent with C—Si relative to the adventitious C—C, C—H peak observed at 284.55 eV.

At the crossover point between C1s (C—C, C—H) and Si2p, the O1s is very low (1.6%). The O1s quickly decreases to 0% within the next 3 nm. The initial analysis suggested that the poly-Si surface was free of carbide or oxide formation from the plasma process. Further advancement in our XPS technique indicate that some carbide formation occurs as evidenced in FIG. 24.

Example 10

Etch data using $CH_3F$, $C_2H_5F$, and 1-F—$C_3H_7$ (1-fluoropropane) collected under 50 W plasma RF power were analyzed. The data compares etch rates and infinite selectivity ranges for different gases operated with lower RF power compared to the above examples. A graph of the SiN, $SiO_2$ and poly-Si etch rates versus $O_2$ flow (in sccm) for fluoromethane ($CH_3F$) is shown in FIG. 25. In FIG. 25, the ISR for fluoromethane ranges from approximately 4.2 sccm $O_2$ to 5.4 sccm $O_2$. The roughness layer thicknesses for each etch condition in FIG. 25 is plotted in FIG. 28. The SiN roughness increases significantly in the ISR for $CH_3F$. As a result, the process window (as defined above) for $CH_3F$ etching at 50 W is only 0.6. A graph of the SiN, $SiO_2$ and poly-Si etch rates versus $O_2$ flow (in sccm) for fluoroethane ($C_2H_5F$) is shown in FIG. 26. In FIG. 26, the ISR for fluoroethane ranges from approximately 6.6 sccm $O_2$ to 7.8 sccm $O_2$. The roughness layer thicknesses for each etch condition in FIG. 26 is plotted in FIG. 29. The SiN roughness increases less abruptly in the ISR for $C_2H_5F$ compared to $CH_3F$. As a result, the process window for $C_2H_5F$ etching at 50 W is 1.2. A graph of the SiN, $SiO_2$ and poly-Si etch rates versus $O_2$ flow (in sccm) for 1-fluoropropane (1-F—$C_3H_7$) is shown in FIG. 27. In FIG. 27, the ISR for fluoropropane ranges from approximately 16.8 sccm $O_2$ to 22.2 sccm $O_2$. The roughness layer thicknesses for each etch condition in FIG. 27 is plotted in FIG. 30. The SiN roughness does not increase in the ISR for 1-F—$C_3H_7$ until very low $O_2$ flow rates. As a result, the process window for 1-F—$C_3H_7$ etching at 50 W is a much wider 4.8 sccm O2. The SiN etch rates in FIGS. 25-27 are significantly lower than the SiN etch rates in FIGS. 2, 3, and 5. The primary difference between the two sets of figures is the RF power which is 200 W for FIGS. 2, 3, and 5, but only 50 W for FIGS. 24-26. The data show that infinite selectivity is attainable under low RF power process conditions. Additionally, the SiN roughness negatively affects the $CH_3F$ process window, while the $C_2H_5F$ and 1-F—$C_3H_7$ process windows are less affected by SiN roughness.

Example 11

Figure 31:
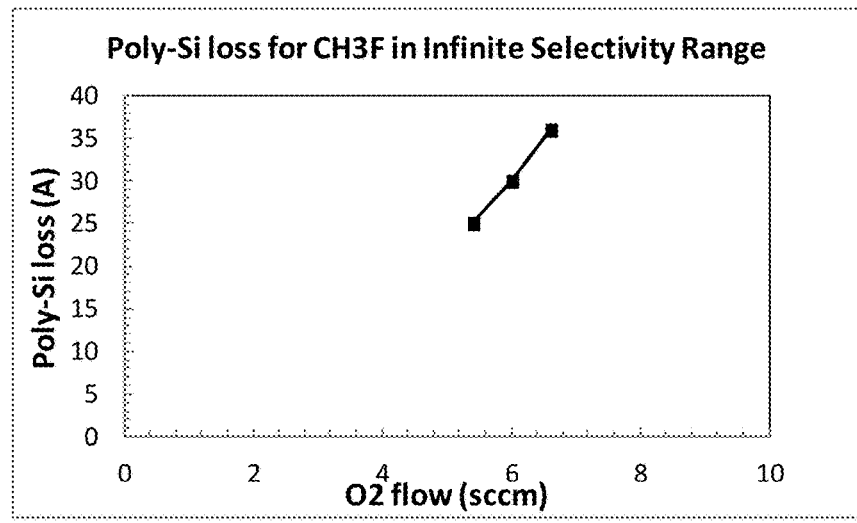
FIG. 31 is a graph of poly-Si loss versus $O_2$ flow for a 200 W $CH_3F$ plasma.
Figure 32:
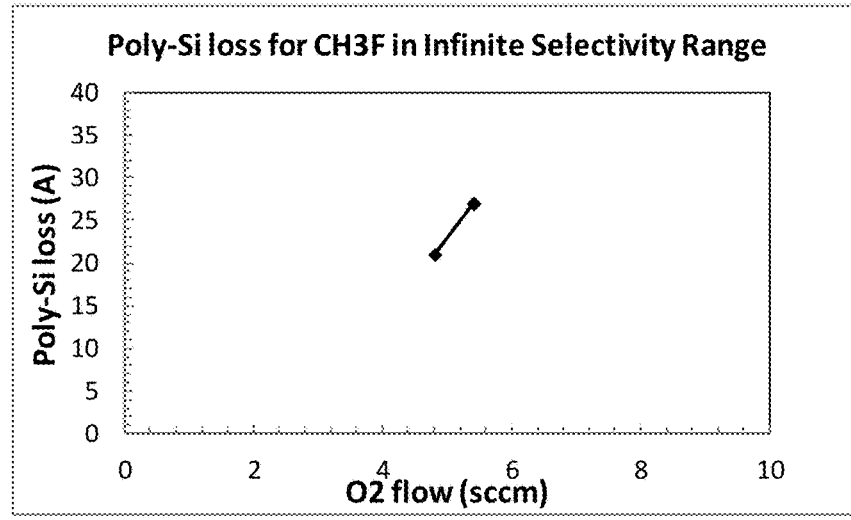
FIG. 32 is a graph of poly-Si loss versus $O_2$ flow for a 50 W $CH_3F$ plasma.
Figure 33:
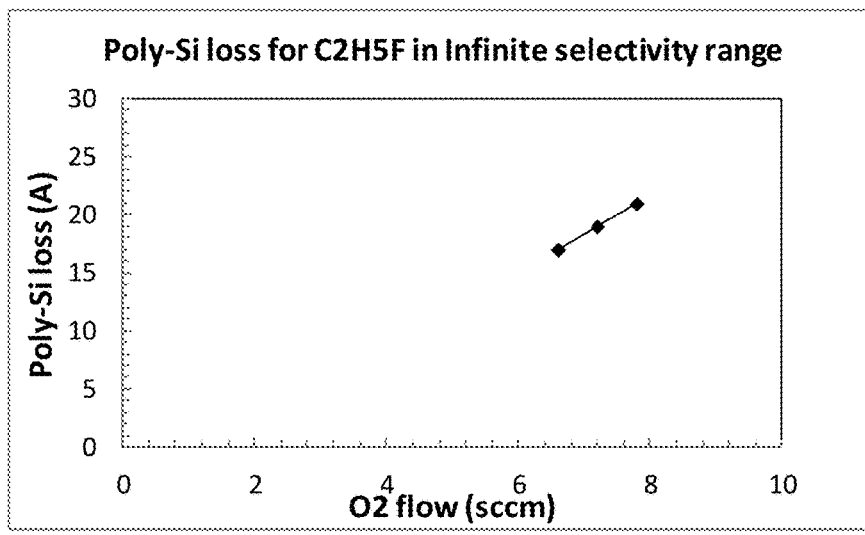
FIG. 33 is a graph of poly-Si loss versus O2 flow for a 50 W C2H5F plasma.
Figure 34:
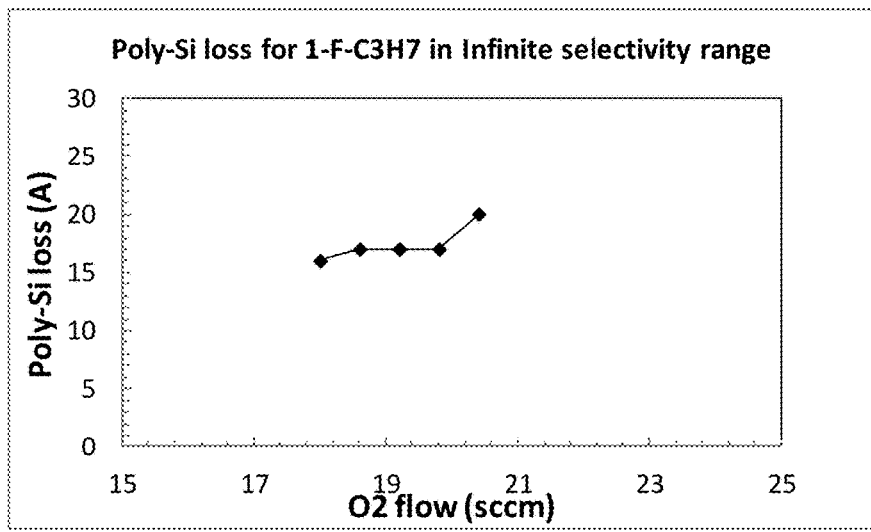
FIG. 34 is a graph of poly-Si loss versus $O_2$ flow for a 50 W 1-F—$C_3H_7$ plasma.

Damage to the substrate as a result of SiN overetching can be detrimental to device performance. It is therefore necessary to evaluate etch gases for their effects on substrate damage and consumption. FIG. 31 shows the poly-Si consumption from an etch/ash cycle for a 200 W $CH_3F$ process. FIG. 32 shows the poly-Si consumption from an etch/ash cycle for a 50 W $CH_3F$ process. FIG. 33 shows the poly-Si consumption from an etch/ash cycle for a 50 W $C_2H_5F$ process. FIG. 34 shows the poly-Si consumption from an etch/ash cycle for a 50 W 1-F—$C_3H_7$ process. Blanket films of poly-Si with were processed with plasma conditions that yield infinite SiN/Poly-Si selectivity. The polymer films that coated the poly-Si were then ashed in a 50 W, $O_2$ plasma. The difference between the initial poly-Si film thickness and the final poly-Si film thickness was plotted versus $O_2$ flow. The data points in the plot represent the full range of conditions where infinite selectivity is achieved for the specific etch gas and process RF power. The poly-Si films processed with 200 W, $CH_3F$ plasmas show significant poly-Si loss (25-35 Å). The poly-Si films processed with 50 W, $CH_3F$ plasmas show less poly-Si loss (21-27 Å), but only for a very narrow range of $O_2$ flow. The poly-Si films processed with 50 W, $C_2H_5F$ plasmas show even less poly-Si loss (17-21 Å), and this low poly-Si loss is maintained for a wider range of $O_2$ flow. The poly-Si films processed with a 50 W, 1-F—$C_3H_7$ plasma show the least poly-Si loss (16-20 Å), and the widest range of $O_2$ flow with low poly-Si loss.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A silicon nitride plasma etching process for etching a SiN layer from a substrate, the method comprising:
   generating on the SiN layer a SiN roughness layer of between approximately 0 nm and approximately 10 nm thickness during the silicon nitride plasma etching process by simultaneously introducing an oxidizer at a flow rate and an etch gas into a plasma reaction chamber containing the substrate, the etch gas having the formula $C_xH_yF_z$, wherein x is 2-5, z is 1 or 2, 2x+2=y+z, and a fluorine atom is located on a terminal carbon atom of the etch gas and the flow rate is selected to simultaneously yield infinite SiN to substrate selectivity and the SiN roughness layer of between approximately 0 nm and approximately 10 nm thickness.

2. The method of claim 1, further comprising determining the flow rate by (a) plotting a SiN etch rate for the etch gas on a Y axis versus oxidizer flow rate on a X axis; (b) plotting a substrate etch rate for the etch gas on a Y axis versus oxidizer flow rate on a X axis; and (c) selecting the flow rate when the SiN etch rate is positive, the substrate etch rate is equal to or less than 0 nm/minute, and the SiN etch rate remains approximately the same with increasing oxidant flow rate.

3. The method of claim 1, further comprising determining the flow rate by optical or surface topography analysis of a substrate having a partial SiN layer deposited thereon to determine an oxidizer flow rate that (a) etches the SiN layer, (b) does not etch the substrate, and (c) does not generate on the SiN layer a SiN roughness layer greater than 10 nm thick, wherein the partial SiN layer does not cover the entire substrate.

4. The method of claim 1, further comprising ending the process by measuring a time when the substrate below the SiN layer begins to accumulate polymer deposits.

5. The method of claim 1, wherein the etch gas selectively reacts with SiN to form volatile by-products, further comprising removing volatile by-products from the plasma reaction chamber.

6. The method of claim 5, further comprising ending the process by analyzing the volatile by-products removed from the plasma reaction chamber to determine when generation of volatile by-products ceases.

7. The method of claim 1, wherein the etch gas is selected from the group consisting of fluoroethane; 1-fluoropropane; 1,1-difluoropropane; 1,2-difluoropropane, 1-fluorobutane, 1,1-difluorobutane, 1,2-difluorobutane, 1-fluoropentane, 1,1-difluoropentane, 1,2-difluoropentane, and combinations thereof.

8. The method of claim 1, wherein z is 1.

9. The method of claim 8, wherein the etch gas is fluoroethane.

10. The method of claim 8, wherein the etch gas is 1-fluoropropane.

11. The method of claim 8, wherein the etch gas is 1-fluorobutane.

12. The method of claim 8, wherein the etch gas is 1-fluoropentane.

13. The method of claim 1, wherein z is 2.

14. The method of claim 13, wherein x is 3.

15. The method of claim 14, wherein the etch gas is 1,1-difluoropropane.

16. The method of claim 15, wherein the etch gas is 1,2-difluoropropane.

17. The method of claim 1, further comprising introducing an inert gas into the plasma reaction chamber, the inert gas being selected from the group consisting of He, Ar, Xe, Kr, and Ne.

18. The method of claim 17, wherein the inert gas comprises approximately 25% by volume to approximately 95% by volume of a total volume of etch gas, oxidizer and inert gas introduced into the plasma reaction chamber.

19. The method of claim 1, wherein the substrate is selected from the group consisting of silicon, polysilicon, silicon oxide, SiGe, Ge, GaAs, InGaAs, InP, InAs, or combinations thereof.

20. The method of claim 19, where in the substrate is polysilicon.

21. The method of claim 1, wherein the oxidizer is selected from the group consisting of $O_2$, CO, $CO_2$, NO, $N_2O$, $NO_2$, $SO_2$, $O_3$, and combinations thereof.

22. The method of claim 21, wherein the oxidizer is $O_2$.

* * * * *